(12) United States Patent
Miyairi et al.

(10) Patent No.: US 8,395,156 B2
(45) Date of Patent: Mar. 12, 2013

(54) DISPLAY DEVICE

(75) Inventors: Hidekazu Miyairi, Kanagawa (JP);
Toshiyuki Isa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 294 days.

(21) Appl. No.: 12/948,251

(22) Filed: Nov. 17, 2010

(65) Prior Publication Data

US 2011/0121300 A1    May 26, 2011

(30) Foreign Application Priority Data

Nov. 24, 2009 (JP) ................................ 2009-266051

(51) Int. Cl.
*H01L 29/04* (2006.01)

(52) U.S. Cl. ................................ 257/59; 257/57; 257/72

(58) Field of Classification Search .................... 257/59, 257/72, 57
See application file for complete search history.

(56) References Cited

U.S. PATENT DOCUMENTS

| | | | |
|---|---|---|---|
| 4,409,134 A | 10/1983 | Yamazaki | |
| 5,432,122 A | 7/1995 | Chae | |
| 5,644,147 A | 7/1997 | Yamazaki et al. | |
| 5,674,758 A | 10/1997 | McCarthy | |
| 6,103,558 A | 8/2000 | Yamanaka et al. | |
| 6,372,558 B1 | 4/2002 | Yamanaka et al. | |
| 6,399,988 B1 | 6/2002 | Yamazaki | |
| 6,479,837 B1 | 11/2002 | Ogawa et al. | |
| 6,504,215 B1 | 1/2003 | Yamanaka et al. | |
| 6,515,648 B1 | 2/2003 | Tanaka et al. | |
| 6,614,076 B2 | 9/2003 | Kawasaki et al. | |
| 6,713,323 B2 | 3/2004 | Yamazaki et al. | |
| 6,756,816 B2 | 6/2004 | Miyake | |
| 6,808,968 B2 | 10/2004 | Yamazaki et al. | |
| 6,825,070 B2 | 11/2004 | Yamanaka et al. | |
| 6,836,308 B2 | 12/2004 | Sawasaki et al. | |
| 6,894,674 B2 | 5/2005 | Nakajima et al. | |
| 6,930,047 B2 | 8/2005 | Yamazaki et al. | |
| 7,196,681 B2 | 3/2007 | Okuda | |
| 7,235,810 B1 | 6/2007 | Yamazaki et al. | |
| 7,316,947 B2 | 1/2008 | Yamazaki et al. | |
| 7,432,906 B2 | 10/2008 | Nakajima et al. | |
| 7,522,145 B2 | 4/2009 | Lee et al. | |
| 2002/0063834 A1 | 5/2002 | Sawasaki et al. | |
| 2002/0107055 A1 | 8/2002 | Yamazaki et al. | |
| 2003/0001800 A1 | 1/2003 | Nakajima et al. | |
| 2003/0043090 A1 | 3/2003 | Yazawa et al. | |
| 2003/0043104 A1 | 3/2003 | Lee et al. | |
| 2005/0012097 A1* | 1/2005 | Yamazaki | 257/59 |
| 2005/0168428 A1 | 8/2005 | Nakajima et al. | |

(Continued)

FOREIGN PATENT DOCUMENTS

JP    09-074204    3/1997
JP    2005-049832    2/2005

*Primary Examiner* — N Drew Richards
*Assistant Examiner* — Yu-Hsi D Sun
(74) *Attorney, Agent, or Firm* — Nixon Peabody LLP; Jeffrey L. Costellia

(57) ABSTRACT

An object is to provide a display device whose frame can be narrowed and whose display characteristics are excellent. The display device includes a driver circuit and a pixel portion. The driver circuit and the pixel portion are formed using a dual-gate thin film transistor and a single-gate thin film transistor, respectively. In the dual-gate thin film transistor in the display device, a semiconductor layer is formed using a microcrystalline semiconductor region and a pair of amorphous semiconductor regions, and a gate insulating layer and an insulating layer are in contact with the microcrystalline semiconductor region of the semiconductor layer.

18 Claims, 21 Drawing Sheets

U.S. PATENT DOCUMENTS

| | | |
|---|---|---|
| 2006/0027804 A1* | 2/2006 | Yamazaki et al. ............. 257/59 |
| 2007/0200803 A1 | 8/2007 | Kimura |
| 2009/0140251 A1* | 6/2009 | Yamazaki ...................... 257/57 |
| 2009/0140259 A1* | 6/2009 | Yamazaki ...................... 257/67 |
| 2010/0102314 A1 | 4/2010 | Miyairi et al. |
| 2010/0117079 A1 | 5/2010 | Miyairi et al. |
| 2010/0252826 A1 | 10/2010 | Yamazaki et al. |
| 2011/0101337 A1 | 5/2011 | Yamazaki |
| 2011/0101354 A1* | 5/2011 | Saito et al. ..................... 257/59 |
| 2011/0101356 A1 | 5/2011 | Yamazaki |

* cited by examiner

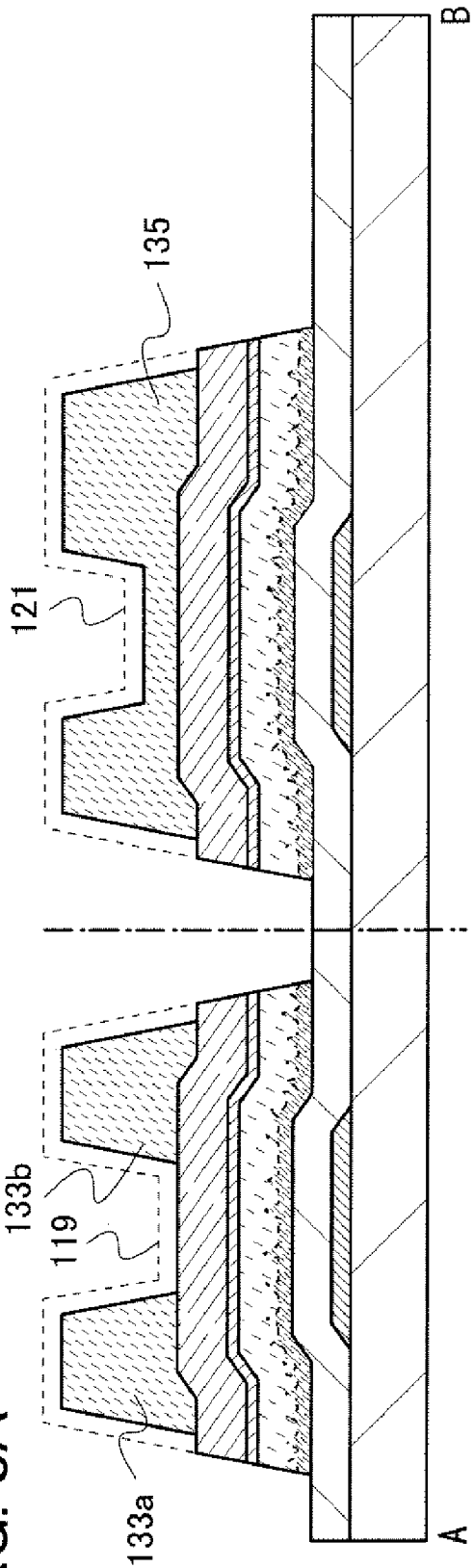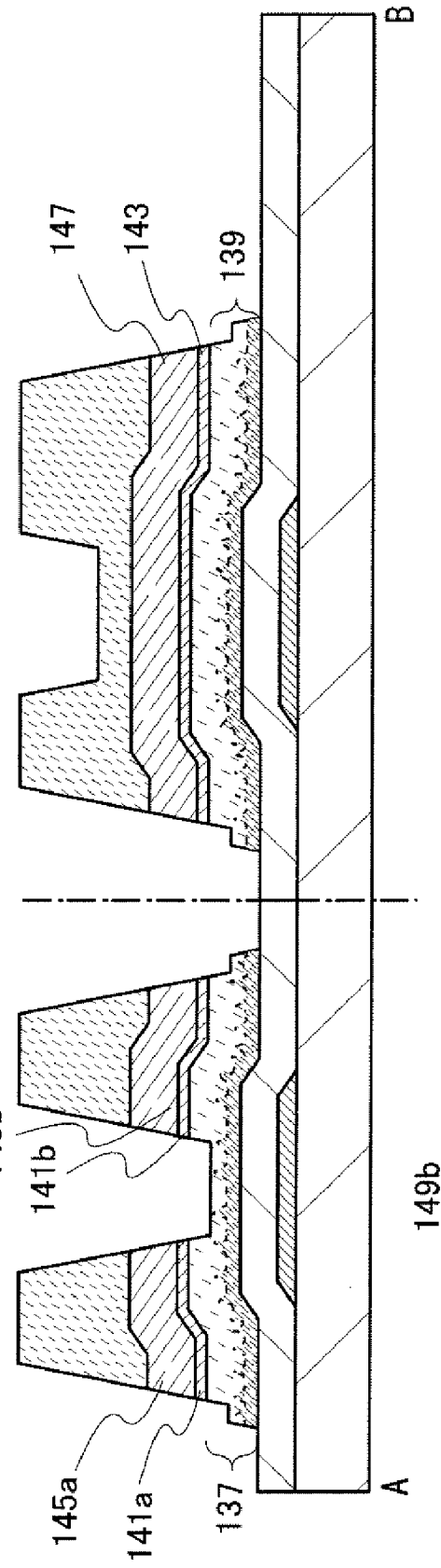

FIG. 11A1
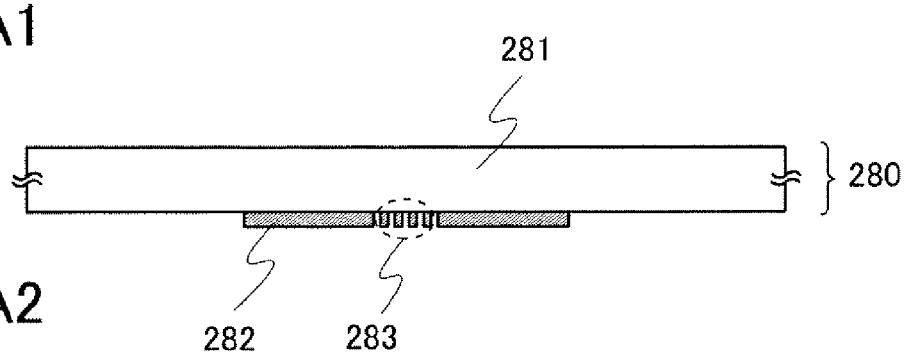
FIG. 11A2
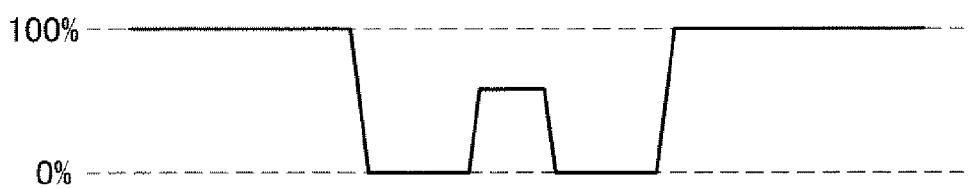
FIG. 11B1
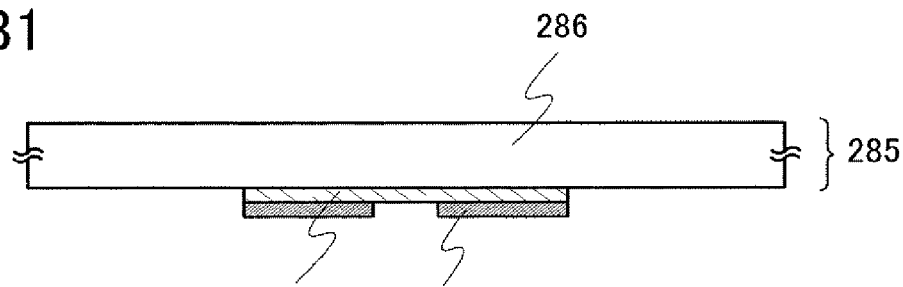
FIG. 11B2
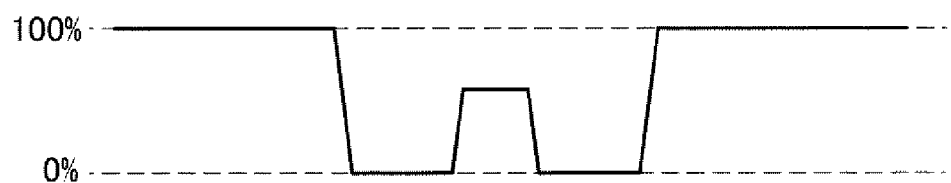

301 303 305 307 309

313  311a  311b  311

315a 315b 317 315

319

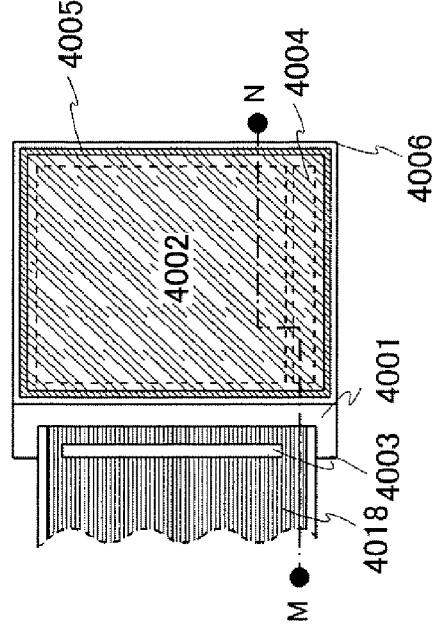
FIG. 16A1
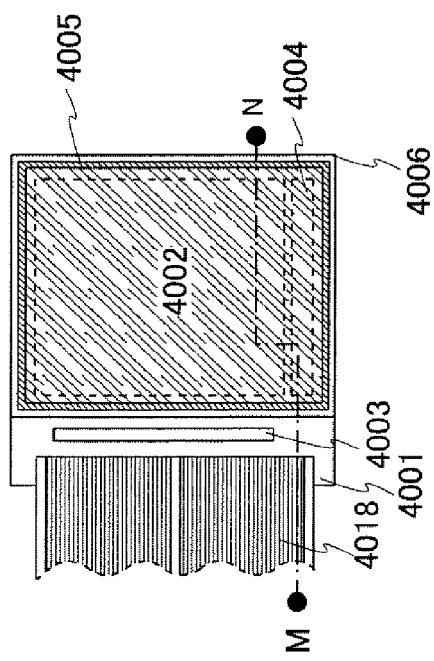
FIG. 16A2
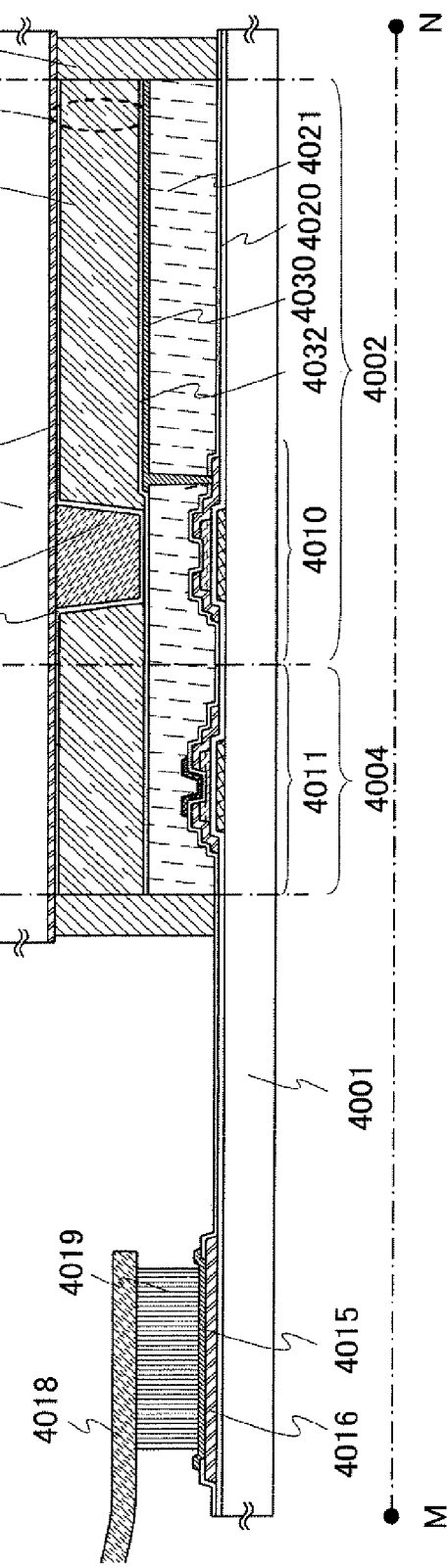
FIG. 16B

DISPLAY DEVICE

BACKGROUND OF THE INVENTION

1. Field of the Invention

The present invention relates to a display device having an inverted staggered thin film transistor in each of a driver circuit and a pixel portion.

2. Description of the Related Art

As one kind of field-effect transistor. a thin film transistor in which a channel formation region is formed using a semiconductor layer formed over a substrate having an insulating surface is known. Techniques in which amorphous silicon, microcrystalline silicon. or polycrystalline silicon is used for the semiconductor layer used in the thin film transistor have been disclosed. A typical application example of the thin film transistor is a liquid crystal display television device, in which the thin film transistor has been put to practical use as a switching transistor for each pixel that constitutes a display screen.

Further, there is a display device in which the number of external components is reduced and thin film transistors formed using amorphous silicon or microcrystalline silicon are used for a gate driver for reduction in cost of the display device (see Patent Document 1).

Reference

[Patent Document]
[Patent Document 1] Japanese Published Patent Application No. 2005-049832

SUMMARY OF THE INVENTION

A thin film transistor in which a channel formation region is formed using an amorphous silicon layer has problems such as low field-effect mobility and low on-state current. Further, when the thin film transistor is used for a long term, there are problems in that the thin film transistor deteriorates, the threshold voltage is shifted, and the on-state current is lowered. In the case where a driver circuit such as a gate driver is formed using thin film transistors in each of which an amorphous silicon layer is used for a channel formation region, the width of the channel formation region is increased, and the area occupied by the thin film transistors is enlarged. Thus, sufficient on-state current is maintained even when the on-state current is lowered due to the shift of the threshold voltage.

Alternatively, the number of the thin film transistors included in the driver circuit is increased and an operating time of each of the thin film transistors is shortened, so that deterioration of the thin film transistors is reduced and sufficient on-state current is maintained.

As a result, in a display device whose driver circuit is formed using thin film transistors in each of which an amorphous silicon layer is used for a channel formation region, a large area occupied by the driver circuit prevents the frame of the display device from being narrowed, and thus the area of a pixel portion which is a display region is reduced.

On the other hand, a thin film transistor in which a channel formation region is formed using a microcrystalline silicon layer has a problem in that, whereas the field-effect mobility is higher than that of the thin film transistor using an amorphous silicon layer, the off-state current is high, and thus sufficient switching characteristics cannot be obtained.

A thin film transistor in which a channel formation region is formed using a polycrystalline silicon layer has characteristics in that the field-effect mobility is far higher than that of the above-described two kinds of thin film transistors and high on-state current can be obtained. Owing to such characteristics, this thin film transistor can be used not only as a switching transistor provided in a pixel but also in a driver circuit for which high-speed operation is required.

However, the thin film transistor in which the channel formation region is formed using a polycrystalline silicon layer has a problem in that the manufacturing cost becomes higher than that of the thin film transistor using an amorphous silicon layer because a step of crystallizing a semiconductor layer is needed. For example, the laser annealing technique needed in the process for manufacturing a polycrystalline silicon layer has a problem in that the area irradiated with a laser beam is small and large-screen liquid crystal panels cannot be produced efficiently.

In view of the above problems, one object of an embodiment of the present invention is to provide a display device of which manufacturing cost can be reduced and of which display characteristics of an image are excellent. Further, another object of an embodiment of the present invention is to provide a display device of which manufacturing cost can be reduced and of which frame can be narrowed.

A display device of one embodiment of the present invention includes a driver circuit formed using a dual-gate thin film transistor, and a pixel portion formed using a single-gate thin film transistor. The dual-gate thin film transistor includes a gate electrode, a gate insulating layer in contact with the gate electrode, a back-gate electrode, an insulating layer in contact with the back-gate electrode, and a semiconductor layer and a wiring provided between the gate insulating layer and the insulating layer. The semiconductor layer includes a microcrystalline semiconductor region in contact with the gate insulating layer and the insulating layer over the gate electrode, and a pair of amorphous semiconductor regions provided between the microcrystalline semiconductor region and the wiring. The single-gate thin film transistor includes a gate electrode, a gate insulating layer in contact with the gate electrode, an insulating layer, and a semiconductor layer and a wiring provided between the gate insulating layer and the insulating layer. The semiconductor layer includes a microcrystalline semiconductor region and an amorphous semiconductor region. The gate insulating layer is in contact with the microcrystalline semiconductor region of the semiconductor layer. The insulating layer is in contact with the amorphous semiconductor region of the semiconductor layer.

In a semiconductor layer of an inverted staggered TFT manufactured in the display device of one embodiment of the present invention, a microcrystalline semiconductor region is formed on a gate insulating layer side, an amorphous semiconductor region is formed on source and drain regions side, and the microcrystalline semiconductor region is flat.

In a semiconductor layer of an inverted staggered TFT manufactured in the display device of one embodiment of the present invention, a microcrystalline semiconductor region is formed on a gate insulating layer side, an amorphous semiconductor region is formed on source and drain regions side, and the microcrystalline semiconductor region is uneven on the source and drain regions side.

Note that the on-state current is current which flows between a source electrode and a drain electrode when a transistor is in an on state. For example, in the case of an n-channel transistor, the on-state current is current which flows between the source electrode and the drain electrode when a gate voltage is higher than the threshold voltage of the transistor.

Further, the off-state current is current which flows between the source electrode and the drain electrode when the transistor is in an off state. For example, in the case of an n-channel transistor, the off-state current is current which flows between the source electrode and the drain electrode when a gate voltage is lower than the threshold voltage of the transistor.

Note that a display device in this specification means an image display device, a light-emitting device, or a light source (including a lighting device). Further, the display device includes the following modules in its category: a module to which a connector such as a flexible printed circuit (FPC), a tape automated bonding (TAB) tape, or a tape carrier package (TCP) is attached; a module having a TAB tape or a TCP which is provided with a printed wiring board at the end thereof; and a module having an integrated circuit (IC) which is directly mounted on a display element by a chip on glass (COG) method.

According to the present invention, the display characteristics of an image can be improved and the cost of the display device can be reduced. Further, the frame of the display device can be narrowed, and thus, the display region of the display device can be enlarged.

BRIEF DESCRIPTION OF THE DRAWINGS

In the accompanying drawings:

FIGS. 8A and 8B are cross-sectional views illustrating a method for manufacturing a display device according to an embodiment of the present invention;

FIGS. 11A1 and 11B1 are cross-sectional views illustrating multi-tone photomasks which can be applied to the present invention and FIGS. 11A2 and 11B2 are diagrams illustrating light transmittance of multi-tone photomasks which can be applied to the present invention;

FIGS. 16A1 and 16A2 are top views and FIG. 16B is a cross-sectional view each illustrating a liquid crystal display device;

DETAILED DESCRIPTION OF THE INVENTION

Figure 1A:
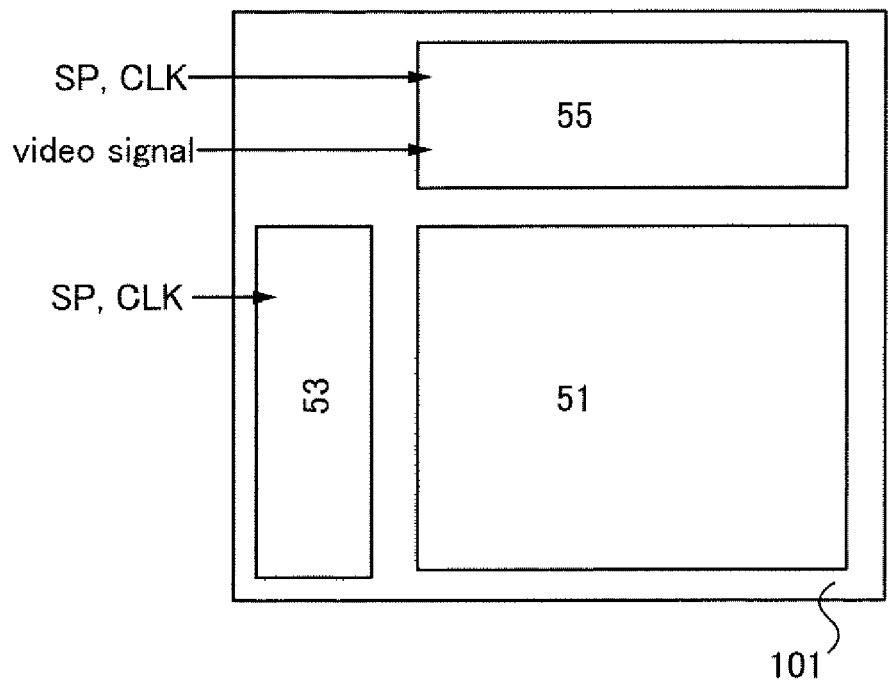
FIGS. 1A and 1B are block diagrams each illustrating a display device according to an embodiment of the present invention.

Hereinafter, embodiments of the present invention are described with reference to the drawings. However, the present invention is not limited to the following description. It is easily understood by those skilled in the art that the modes and detail can be variously changed without departing from the scope and spirit of the present invention. Therefore, the present invention is not construed as being limited to the following description of the embodiments and examples. In describing structures of the present invention with reference to the drawings, the same reference numerals are used in common for the same portions in different drawings.

[Embodiment 1]

In this embodiment, a display device which is one embodiment of the present invention will be described with reference to FIGS. 1A and 1B, FIGS. 2A to 2C. FIGS. 3A to 3C, and FIG. 4. As for a thin film transistor used for a display device, an n-channel transistor has higher carrier mobility than a p-channel transistor. Further, it is preferable that all thin film transistors formed over one substrate have the same polarity because the number of manufacturing steps can be reduced. Therefore, in this embodiment. an n-channel thin film transistor will be described.

FIG. 1A is a block diagram illustrating an example of an active matrix liquid crystal display device. The liquid crystal display device illustrated in FIG. 1A includes a pixel portion 51 including a plurality of pixels each provided with a display element, a scan line driver circuit 53 controlling a scan line connected to a gate electrode of each pixel, and a signal line driver circuit 55 controlling a video signal input to a selected pixel, over a substrate 101.

Figure 1B:
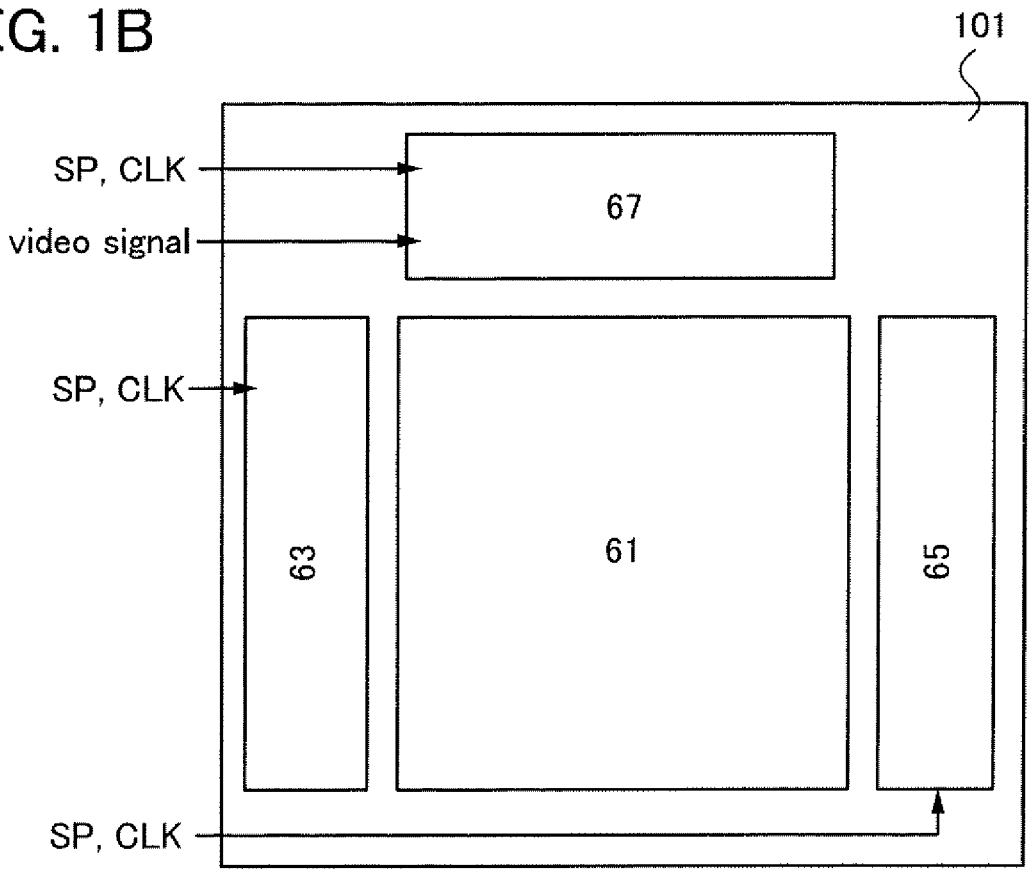

FIG. 1B is a block diagram illustrating an example of an active matrix light-emitting display device to which the present invention is applied. The light-emitting display device illustrated in FIG. 1B includes a pixel portion 61 including a plurality of pixels each provided with a display element, a first scan line driver circuit 63 and a second scan line driver circuit 65 which control a scan line connected to a gate electrode of each pixel, and a signal line driver circuit 67 controlling a video signal input to a selected pixel, over the substrate 101. In the case where a switching TFT (thin film transistor) and a current controlling TFT are arranged in one pixel, in the light-emitting display device illustrated in FIG. 1B, a signal inputted to a first scan line connected to a gate electrode of the switching TFT is generated in the first scan line driver circuit 63 and a signal inputted to a second scan line connected to a gate electrode of the current controlling TFT is generated in the second scan line driver circuit 65. Note that the signal inputted to the first scan line and the signal inputted to the second scan line may be generated in one scan line driver circuit. Further, for example, a plurality of first scan lines used for controlling operation of a switching element may be provided in each pixel, depending on the number of TFTs included in the switching element. In this case, all signals inputted to a plurality of the first scan lines may be generated in one scan line driver circuit, or by providing a plurality of scan line driver circuits, the signals may be generated in their respective scan line driver circuits.

Note that modes in which the scan line driver circuit 53, the first scan line driver circuit 63, the second scan line driver circuit 65, and the signal line driver circuits 55 and 67 are formed in the display devices are described here; however, part of the scan line driver circuit 53, the first scan line driver circuit 63, or the second scan line driver circuit 65 may be mounted using a semiconductor device such as an IC. Alternatively, part of the signal line driver circuits 55 and 67 may be mounted using a semiconductor device such as an IC.

The signal line driver circuit includes a shift register circuit and an analog switch. Note that the following structure may be employed: a plurality of analog switches are provided for one output signal in a shift register, image signals are distributed to a greater number of signal lines than the number of wirings which supplies image signals, and thus the image signals are supplied to respective pixels.

The pixel portions 51 and 61 each include a plurality of pixels arranged in matrix. Each pixel includes a pixel TFT connected to a scan line and a signal line, a storage capacitor element, and a pixel electrode.

One electrode of the storage capacitor element is connected to the pixel TFT and the other electrode of the storage capacitor element is connected to a capacitor line. The pixel electrode serves as one electrode which drives a display element (such as a liquid crystal element, a light-emitting element, or a contrast medium (electronic ink)). The other electrode of the display element is connected to a common terminal.

A protective circuit is provided between a signal line input terminal and the signal line driver circuit 55, between a signal line input terminal and the signal line driver circuit 67, or between a scan line input terminal and the scan line driver circuit 53, the first scan line driver circuit 63, or the second scan line driver circuit 65, so as to prevent breakage of a pixel TFT and the like when surge voltage due to static electricity or the like is applied to a scan line, a signal line, and a capacitor wiring. Therefore, the protective circuit is formed so that charge is released to a common wiring when the surge voltage is applied.

Figure 2A:
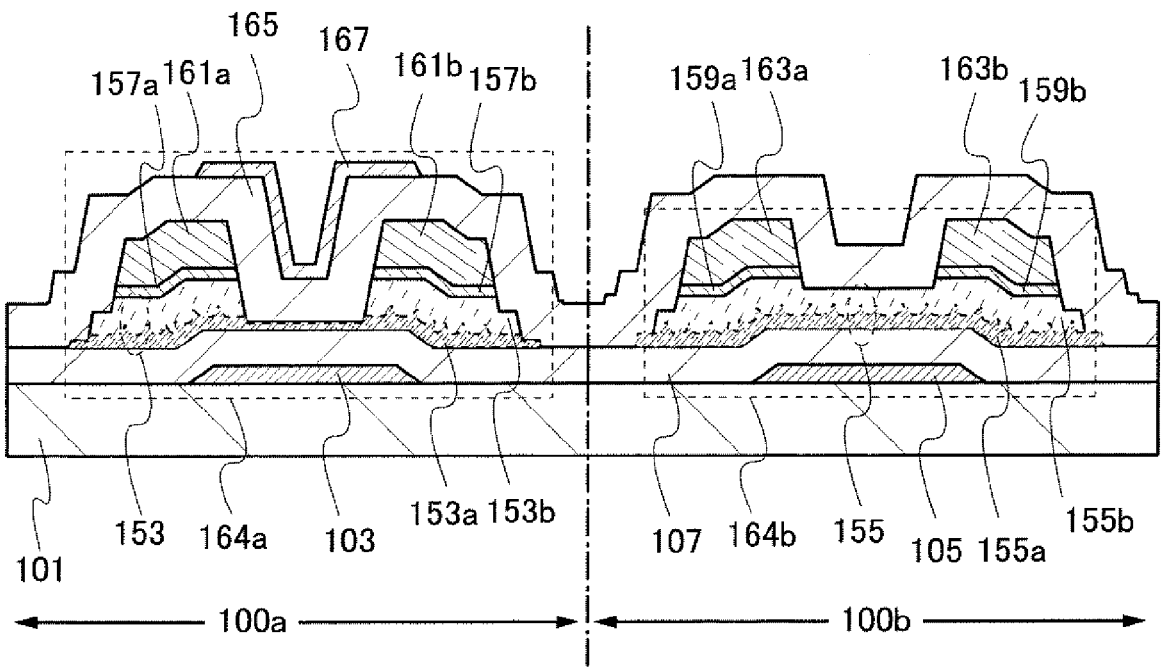
FIGS. 2A to 2C are cross-sectional views illustrating a display device according to an embodiment of the present invention.

Next, the structures of thin film transistors included in the scan line driver circuit 53, the first scan line driver circuit 63, the second scan line driver circuit 65, the signal line driver circuits 55 and 67, and the pixel portions 51 and 61 will be described with reference to FIGS. 2A to 2C. In FIG. 2A, the scan line driver circuit 53, the first scan line driver circuit 63, the second scan line driver circuit 65, and the signal line driver circuits 55 and 67 are represented by a driver circuit 100a.

FIG. 2A is a cross-sectional view of a thin film transistor 164a included in the driver circuit 100a and a thin film transistor 164b included in a pixel portion 100b.

The thin film transistor 164a included in the driver circuit 100a is a dual-gate thin film transistor. The thin film transistor 164a includes a gate electrode 103, a semiconductor layer 153, a gate insulating layer 107 provided between the gate electrode 103 and the semiconductor layer 153, impurity semiconductor layers 157a and 157b which serve as a source region and a drain region in contact with the semiconductor layer 153, and wirings 161a and 161b in contact with the impurity semiconductor layers 157a and 157b, over the substrate 101. The thin film transistor 164a includes an insulating layer 165 covering the semiconductor layer 153, the impurity semiconductor layers 157a and 157b, and the wirings 161a and 161b, and an electrode overlapping with the semiconductor layer 153 over the insulating layer 165. Here, the electrode which faces the semiconductor layer 153 with the insulating layer 165 provided therebetween is denoted by a back-gate electrode 167.

The semiconductor layer 153 includes a microcrystalline semiconductor region 153a and an amorphous semiconductor region 153b which is divided into two parts (thus, also referred to as a pair of amorphous semiconductor regions 153b). The microcrystalline semiconductor region 153a has a surface which is in contact with the gate insulating layer 107 (hereinafter, referred to as a first surface) and a surface which faces the first surface and is in contact with the pair of amorphous semiconductor regions 153b and the insulating layer 165 (hereinafter, referred to as a second surface). The amorphous semiconductor region 153b has a surface which is in contact with the microcrystalline semiconductor region 153a (hereinafter, referred to as a first surface) and a surface which faces the first surface and is in contact with the pair of impurity semiconductor layers 157a and 157b (hereinafter, referred to as a second surface). That is, in a region of the semiconductor layer 153 which overlaps with the gate electrode 103, the microcrystalline semiconductor region 153a is in contact with the gate insulating layer 107 which is in contact with the gate electrode 103 and the insulating layer 165 which is in contact with the back-gate electrode 167.

In the dual-gate thin film transistor, the potentials of the gate electrode 103 and the back-gate electrode 167 can be different. Thus, the threshold voltage of the thin film transistor can be controlled. Alternatively, the same potential can be applied to the gate electrode 103 and the back-gate electrode 167. Thus, channels are formed in the first and second surfaces of the microcrystalline semiconductor region 153a.

The thin film transistor 164b included in the pixel portion 100b is a single-gate thin film transistor. The thin film transistor 164b includes a gate electrode 105, a semiconductor layer 155, the gate insulating layer 107 provided between the gate electrode 105 and the semiconductor layer 155, impurity semiconductor layers 159a and 159b which serve as a source region and a drain region in contact with the semiconductor layer 155, and wirings 163a and 163b in contact with the impurity semiconductor layers 159a and 159b, over the substrate 101.

The semiconductor layer 155 includes a microcrystalline semiconductor region 155a and an amorphous semiconductor region 155b. The microcrystalline semiconductor region 155a has a surface which is in contact with the gate insulating layer 107 (hereinafter, referred to as a first surface) and a surface which faces the first surface and is in contact with the amorphous semiconductor region 155b (hereinafter, referred to as a second surface). The amorphous semiconductor region 155b has a surface which is in contact with the microcrystalline semiconductor region 155a (hereinafter, referred to as a first surface) and a surface which faces the first surface and is in contact with the pair of impurity semiconductor layers 159a and 159b and the insulating layer 165 (hereinafter, referred to as a second surface). That is, in a region of the semiconductor layer 155 which overlaps with the gate electrode 105, the microcrystalline semiconductor region 155a is in contact with the gate insulating layer 107 which is in contact with the gate electrode 105 and the amorphous semiconductor region 155*b* is in contact with the insulating layer 165.

In the dual-gate thin film transistor, channels through which carriers flow are formed in two portions of the microcrystalline semiconductor region 153*a*: in the vicinity of an interface on the gate insulating layer 107 side and the vicinity of an interface on the insulating layer 165 side. Therefore, the amount of transfer of carriers is increased and the on-state current and the field-effect mobility can be increased. The driver circuit 100*a* includes the dual-gate thin film transistor 164*a*, so that the area of a thin film transistor and a driver circuit of a display device can be reduced. Accordingly, the frame of the display device can be narrowed.

On the other hand, the back channel side of the thin film transistor 164*b* includes the amorphous semiconductor region 155*b*. An amorphous semiconductor has higher resistance and lower mobility than a microcrystalline semiconductor; thus, leakage current in the off state can be reduced and high switching characteristics are obtained. Accordingly, the pixel portion 100*b* is formed using the thin film transistor 164*b*, so that the contrast of the display device can be improved.

Next, each structure of the thin film transistors 164*a* and 164*b* will be described below.

As the substrate 101, a glass substrate, a ceramic substrate, a plastic substrate which has high heat resistance enough to withstand a process temperature of this manufacturing process, or the like can be used. In the case where the substrate does not need a light-transmitting property, a metal substrate, such as a stainless steel alloy substrate, provided with an insulating layer over its surface may be used. As a glass substrate, for example. an alkali-free glass substrate formed using barium borosilicate glass, aluminoborosilicate glass, aluminosilicate glass, or the like may be used. Further, as the glass substrate 101, a glass substrate having any of the following sizes can be used: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), and the 10th generation (2950 mm×3400 mm).

The gate electrodes 103 and 105 can be formed as a single layer or a stacked layer using a metal material such as molybdenum, titanium, chromium, tantalum, tungsten, aluminum, copper, neodymium, scandium, or nickel or an alloy material which contains any of these metal materials as its main component. A semiconductor layer typified by polycrystalline silicon doped with an impurity element such as phosphorus, an AgPdCu alloy, an Al—Nd alloy, an Al—Ni alloy, or the like may be used.

For example, as a two-layer structure of the gate electrodes 103 and 105, a two-layer structure in which a molybdenum layer is stacked over an aluminum layer, a two-layer structure in which a molybdenum layer is stacked over a copper layer, a two-layer structure in which a titanium nitride layer or a tantalum nitride is stacked over a copper layer, a two-layer structure in which a titanium nitride layer and a molybdenum layer are stacked, a two-layer structure in which a copper-magnesium-oxide alloy layer and a copper layer are stacked, a two-layer structure in which a copper-manganese-oxide alloy layer and a copper layer are stacked, a two-layer structure in which a copper-manganese alloy layer and a copper layer are stacked, or the like is preferable. As a three-layer structure, a three-layer structure in which a tungsten layer or a tungsten nitride layer, an aluminum-silicon alloy layer or an aluminum-titanium alloy layer, and a titanium nitride layer or a titanium layer are stacked is preferable. When a metal layer serving as a barrier layer is stacked over a layer with low electric resistance, electric resistance can be reduced and diffusion of a metal element from the metal layer into the semiconductor layer can be prevented.

The gate insulating layer 107 can be formed as a single layer or a stacked layer using any of a silicon oxide layer, a silicon nitride layer, a silicon oxynitride layer, and a silicon nitride oxide layer by a CVD method, a sputtering method, or the like. Further, the gate insulating layer 107 is formed using silicon oxide or silicon oxynitride, so that fluctuation in the threshold voltage of the thin film transistor can be suppressed.

In this specification, silicon oxynitride contains more oxygen than nitrogen. In the case where measurements are performed using Rutherford backscattering spectrometry (RBS) and hydrogen forward scattering spectrometry (HFS), silicon oxynitride preferably contains oxygen, nitrogen, silicon, and hydrogen at 50 at. % to 70 at. %, 0.5 at. % to 15 at. %, 25 at. % to 35 at. %, and 0.1 at. % to 10 at. %, respectively. Further, silicon nitride oxide contains more nitrogen than oxygen. In the case where measurements are performed using RBS and HFS, silicon nitride oxide preferably contains oxygen, nitrogen, silicon, and hydrogen at 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

In the semiconductor layers 153 and 155, the microcrystalline regions 153*a* and 155*a* and the amorphous semiconductor regions 153*b* and 155*b* are stacked, respectively. Further, in this embodiment, the microcrystalline semiconductor regions 153*a* and 153*b* are uneven.

Here, a detailed structure of the semiconductor layers 153 and 155 is described. FIGS. 2B and 2C each illustrate an enlarged view of a region between the gate insulating layer 107 and the impurity semiconductor layer 157*a* serving as a source or drain region included in the thin film transistor 164*a* in FIG. 2A.

As illustrated in FIG. 2A, the microcrystalline semiconductor regions 153*a* and 155*a* are uneven. A projected portion of the microcrystalline semiconductor regions 153*a* and 155*b* has a projected (conical or pyramidal) shape whose tip is narrowed from the gate insulating layer 107 toward the amorphous semiconductor regions 153*b* and 155*b* (the projected portion has an acute angle). Note that the projected portion of the microcrystalline semiconductor regions 153*a* and 155*b* may have a projected (inverted conical or inverted pyramidal) shape whose width is increased from the gate insulating layer 107 toward the amorphous semiconductor regions 153*b* and 155*b*.

The microcrystalline semiconductor regions 153*a* and 155*a* are each formed using a microcrystalline semiconductor. The microcrystalline semiconductor is a semiconductor having an intermediate structure between an amorphous structure and a crystalline structure (including a single-crystal structure and a polycrystalline structure). A microcrystalline semiconductor is a semiconductor having a third state that is stable in terms of free energy and is a crystalline semiconductor having short-range order and lattice distortion, in which columnar or needle-like crystal grain having a diameter of greater than or equal to 2 nm and less than or equal to 200 nm, preferably greater than or equal to 10 nm and less than or equal to 80 nm, further preferably greater than or equal to 20 nm and less than or equal to 50 nm grow in a normal direction with respect to the substrate surface. Therefore, a crystal grain boundary is formed at the interface of the columnar or needle-like crystal grains in some cases. Note that the diameter of the grain here means a maximum diameter of a crystal grain in a plane parallel to the substrate surface. Further. the crystal grain includes an amorphous semiconductor region and a crystallite which is a minute crystal that can be regarded as a single crystal. The crystal grain may include a twin crystal.

The Raman spectrum of microcrystalline silicon. which is a typical example of a microcrystalline semiconductor, is shifted to the lower wavenumbers side than 520 $cm^{-1}$, which represents a peak of the Raman spectrum of single crystal silicon. That is, the peak of the Raman spectrum of the microcrystalline silicon is between 520 $cm^{-1}$ which represents single crystal silicon and 480 $cm^{-1}$ which represents amorphous silicon. In addition, the microcrystalline silicon contains hydrogen or halogen of at least 1 at. % or more in order to terminate a dangling bond. Moreover, the microcrystalline silicon may contain a rare gas element such as helium, argon, krypton, or neon to further promote lattice distortion, so that stability is increased and a favorable microcrystalline semiconductor can be obtained. Such a microcrystalline semiconductor is disclosed in, for example, U.S. Pat. No. 4,409,134.

The thicknesses of the microcrystalline semiconductor regions 153a and 155a, that is, the distances from the interface between each of the microcrystalline semiconductor regions 153a and 155a and the gate insulating layer 107 to the tip of the projection (projected portion) are each set to greater than or equal to 3 nm and less than or equal to 410 nm, preferably greater than or equal to 20 nm and less than or equal to 100 nm, so that the off-state current of the thin film transistors can be reduced.

It is preferable that the concentration of oxygen and nitrogen contained in the semiconductor layers 153 and 155 measured by secondary ion mass spectrometry be less than $1 \times 10^{18}$ atoms/$cm^3$ because the crystallinity of the microcrystalline semiconductor regions 153a and 155a can be improved.

The amorphous semiconductor regions 153b and 155b are formed using an amorphous semiconductor, an amorphous semiconductor including halogen, or an amorphous semiconductor containing nitrogen. Nitrogen of the amorphous semiconductor containing nitrogen may exist, for example, as an NH group or an $NH_2$ group. The amorphous semiconductor is formed using amorphous silicon.

The amorphous semiconductor containing nitrogen is a semiconductor having a small amount of the defect absorption spectrum and low energy at an Urbach edge, measured by a constant photocurrent method (CPM) or photoluminescence spectroscopy, compared to a conventional amorphous semiconductor. That is, as compared to the conventional amorphous semiconductor, the amorphous semiconductor containing nitrogen is a well-ordered semiconductor which has few defects and whose tail of a level at a band edge in the valence band is steep. Since the amorphous semiconductor containing nitrogen has a steep tail of a level at a band edge in the valence band, the band gap is wide and tunneling current does not easily flow. Therefore, by providing the amorphous semiconductor containing nitrogen on the back channel side, the off-state current of the thin film transistor can be reduced. In addition, by providing the amorphous semiconductor containing nitrogen, the on-state current and the field-effect mobility can be increased.

Further, a peak region of a spectrum obtained by performing low-temperature photoluminescence spectroscopy on the amorphous semiconductor containing nitrogen is greater than or equal to 1.31 eV and less than or equal to 1.39 eV. Note that a peak region of a spectrum obtained by performing low-temperature photoluminescence spectroscopy on a microcrystalline semiconductor, typically microcrystalline silicon is greater than or equal to 0.98 eV and less than or equal to 1.02 eV. Accordingly, the amorphous semiconductor containing nitrogen is different from a microcrystalline semiconductor.

Similarly to the amorphous semiconductor regions 153b and 155b, the microcrystalline semiconductor regions 153a and 155a also may include an NH group or an $NH_2$ group.

Figure 2B:
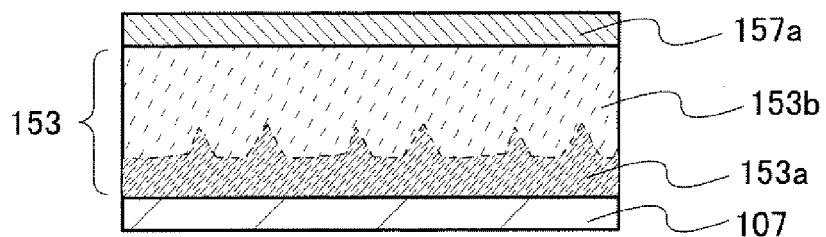
Figure 2C:
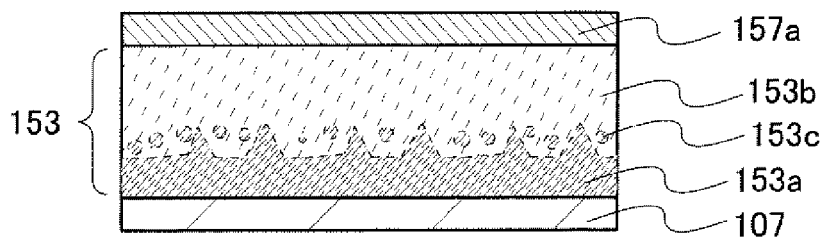

As illustrated in FIG. 2C, a semiconductor crystal grain 153c having a diameter of greater than or equal to 1 nm and less than or equal to 10 nm, preferably greater than or equal to 1 nm and less than or equal to 5 nm, is included in the amorphous semiconductor regions 153b and 155b, so that the on-state current and the field-effect mobility can be increased.

The microcrystalline semiconductor having a projected (conical or pyramidal) shape whose tip is narrowed from the gate insulating layer 107 toward the amorphous semiconductor regions 155b and 155b or the microcrystalline semiconductor having a projecting shape whose width increased from the gate insulating layer 107 toward the amorphous semiconductor regions 153b and 155b is formed in the following manner: a microcrystalline semiconductor layer 109 is formed under the condition that a microcrystalline semiconductor is deposited, and after that, the crystal grows under the condition that the crystal grow is suppressed and an amorphous semiconductor is deposited.

The impurity semiconductor layers 157a, 157b, 159a, and 159b are formed using amorphous silicon to which phosphorus is added, microcrystalline silicon to which phosphorus is added, or the like. The structure in which amorphous silicon to which phosphorus is added and microcrystalline silicon to which phosphorus is added are stacked can also be employed. Note that in the case where a p-channel thin film transistor is formed as the thin film transistor, the impurity semiconductor layers 157a, 157b, 159a, and 159b are made of microcrystalline silicon to which boron is added, amorphous silicon to which boron is added, or the like. Note that when ohmic contacts are formed between the semiconductor layers 153 and 155 and the wirings 161a, 161b, 163a, and 163b, the impurity semiconductor layers 157a, 157b, 159a, and 159b are not necessarily formed.

When the impurity semiconductor layers 157a, 157b, 159a, and 159b are formed using amorphous silicon to which phosphorus is added or microcrystalline silicon to which boron is added, characteristics of the interface can be improved by forming a microcrystalline semiconductor layer, typically a microcrystalline silicon layer, between the semiconductor layers 153 and 155 and the impurity semiconductor layers 157a, 157b, 159a, and 159b. As a result, resistance generated at the interface between the impurity semiconductor layers 157a, 157b, 159a, and 159b and the semiconductor layers 153 and 155 can be reduced. Consequently, the amount of current flowing through the source region, the semiconductor layer, and the drain region of the thin film transistor can be increased and the on-state current and the field-effect mobility can be increased.

The wirings 161a, 161b, 163a, and 163b can be formed as a single layer or a stacked layer using any of aluminum, copper, titanium, neodymium, scandium, molybdenum, chromium, tantalum, tungsten, and the like. An aluminum alloy to which an element to prevent a hillock is added (e.g., an Al—Nd alloy which can be used for the gate electrodes 103 and 105) may be used. Alternatively, crystalline silicon to which an impurity element which serves as a donor is added may be used. The wirings 161a, 161b, 163a, and 163b may have a stacked-layer structure in which a layer on the side that is in contact with the crystalline silicon to which an impurity element serving as a donor is added is formed using titanium, tantalum, molybdenum, tungsten, or nitride of any of these elements, and a layer of aluminum or an aluminum alloy is formed thereover. Further alternatively, the wirings 161a, 161b, 163a, and 163b may have a stacked-layer structure in which upper and lower surfaces of aluminum or an aluminum alloy are sandwiched between layers of any of titanium, tantalum, molybdenum, tungsten, or nitride.

The insulating layer 165 can be formed in a manner similar to that of the gate insulating layer 107. Further, the insulating layer 165 can be formed using an organic resin layer. As the organic resin layer, acrylic, epoxy, polyimide, polyimide, polyvinylphenol, benzocyclobutene, or the like can be used. Alternatively, a siloxane polymer can be used.

The back-gate electrode 167 can be formed in a manner similar to that of the wirings 161a, 161b, 163a, and 163b. Further, the back-gate electrode 167 can be formed using indium oxide including tungsten oxide, indium zinc oxide including tungsten oxide, indium oxide including titanium oxide, indium tin oxide including titanium oxide, indium tin oxide, indium zinc oxide, indium tin oxide to which silicon oxide is added, or the like.

Alternatively, the back-gate electrode 167 can be formed using a conductive composition containing a light-transmitting conductive high molecule (also referred to as a conductive polymer). The back-gate electrode 167 preferably has a sheet resistance of less than or equal to 10000 Ω/square and a light transmittance of greater than or equal to 70% at a wavelength of 550 nm. Further, the resistivity of the conductive high molecule contained in the conductive composition is preferably less than or equal to 0.1 Ω·cm.

As the conductive high molecule, a so-called π-electron conjugated conductive high molecule can be used. For example, polyaniline or a derivative thereof, polypyrrole or a derivative thereof, polythiophene or a derivative thereof, and a copolymer of two or more kinds of these materials can be given.

Next, a shape of a back-gate electrode will be described with reference to FIGS. 3A to 3C which are top views of the thin film transistor 164a.

Figure 3A:
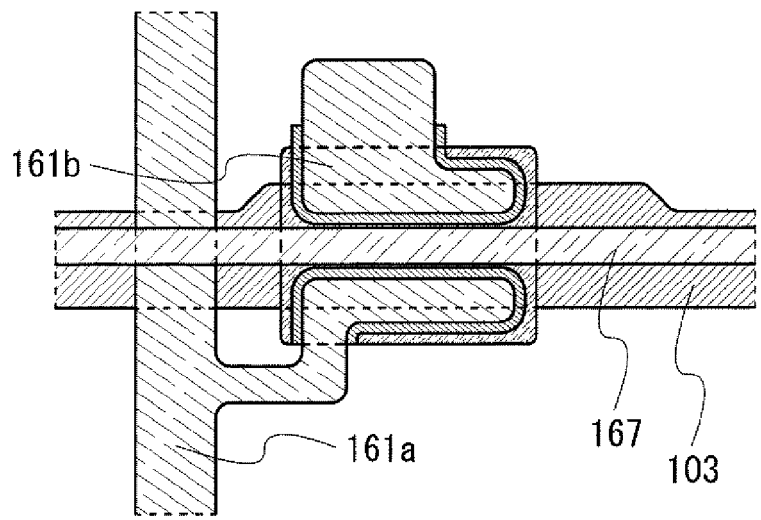
FIGS. 3A to 3C are top views each illustrating a display device according to an embodiment of the present invention.

As shown in FIG. 3A, the back-gate electrode 167 can be formed in parallel to the gate electrode 103. In this case, the potential applied to the back-gate electrode 167 and the potential applied to the gate electrode 103 can be separately controlled as appropriate. Thus, the threshold voltage of the thin film transistor can be controlled.

Figure 3B:
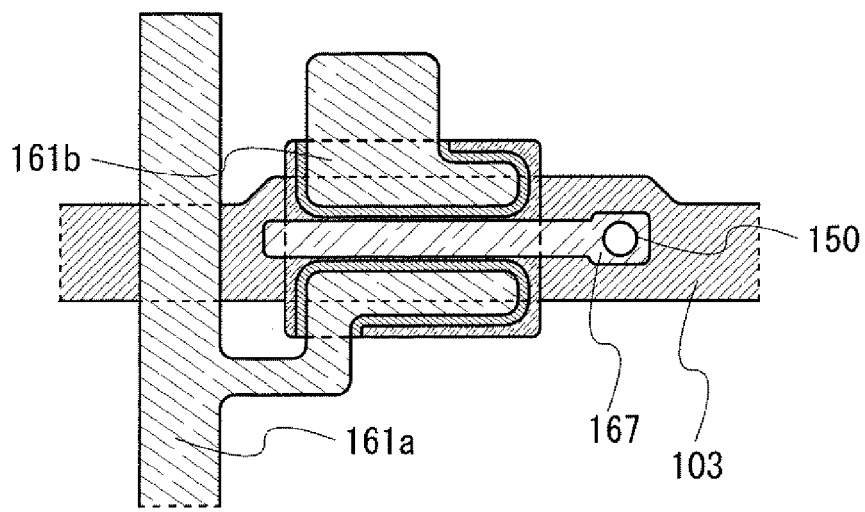

As shown in FIG. 3B, the back-gate electrode 167 can be connected to the gate electrode 103. Through an opening portion 150 formed in the gate insulating layer 107 and the insulating layer 165, the gate electrode 103 and the back-gate electrode 167 can be connected. In this case, the potential applied to the back-gate electrode 167 and the potential applied to the gate electrode 103 are equal. As a result, a region in which carriers flow, that is, channels are formed on the gate insulating layer 107 side and the insulating layer 165 side in the microcrystalline semiconductor region of the semiconductor layer. Therefore, the on-state current of the thin film transistor can be increased.

Figure 3C:
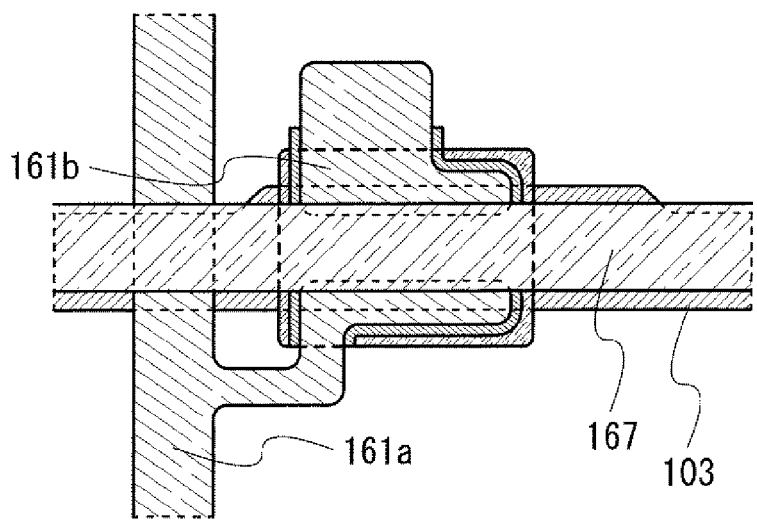

As shown in FIG. 3C, the back-gate electrode 167 may overlap with the wirings 161a and 161b with the insulating layer 165 provided therebetween. Here, the back-gate electrode 167 of FIG. 2A which is made to overlap with the wirings 161a and 161b is used for description of FIG. 3C; however, the back-gate electrode 167 illustrated in FIG. 3B also may overlap with the wirings 161a and 161b.

Figure 4:
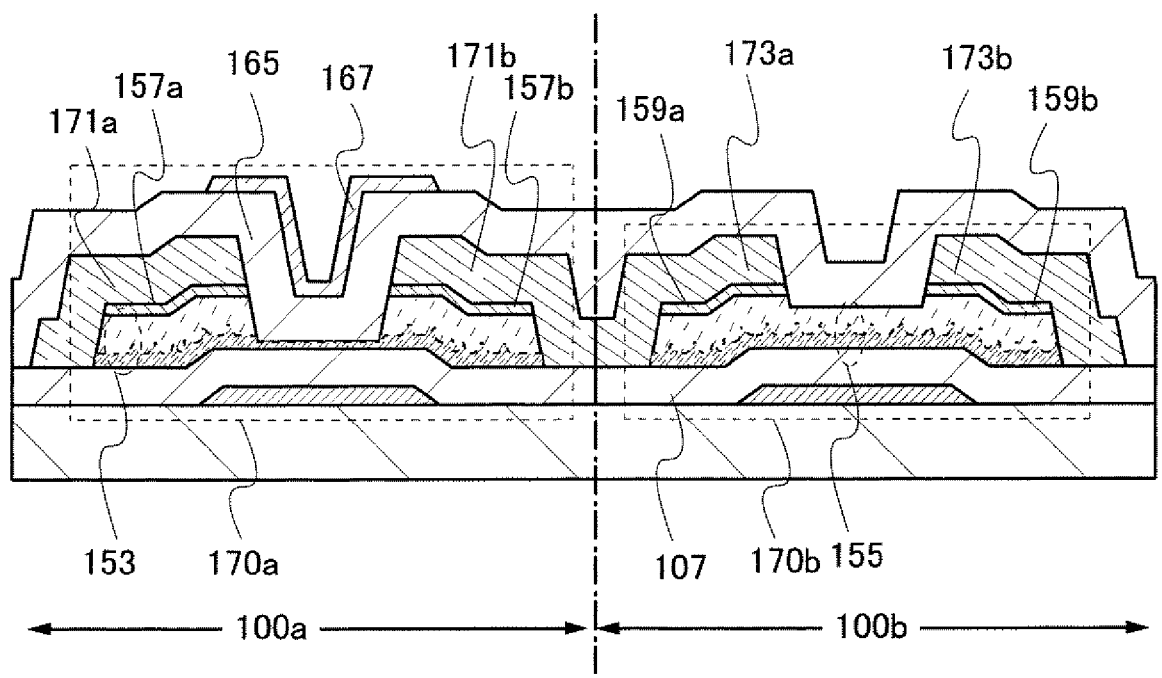
FIG. 4 is a cross-sectional view illustrating a display device according to an embodiment of the present invention.

Note that the thin film transistors illustrated in FIGS. 2A to 2C can have a structure like that of the thin film transistors illustrated in FIG. 4. In FIG. 4, a thin film transistor 170a formed in the driver circuit 100a corresponds to the thin film transistor 164a in FIG. 2A and a thin film transistor 170b formed in the pixel portion 100b corresponds to the thin film transistor 164b in FIG. 2A.

The thin film transistors 170a and 170b are characterized in that wirings 171a, 171b, 173a, and 173b are in contact with not only the top surfaces of the impurity semiconductor layers 157a, 157b, 159a, and 159b but also the side surfaces thereof and the side surfaces of the semiconductor layers 153 and 155.

In the display device described above, part of the driver circuit can be formed over the substrate; therefore the cost of the display device can be reduced. In this embodiment, the thin film transistor forming the driver circuit is a dual-gate thin film transistor, so that channels in which carriers flow are formed in two portions, that is, in the vicinity of an interface with the gate insulating layer 107 and in the vicinity of an interface with the insulating layer 165 of the microcrystalline semiconductor region. Therefore, the amount of carrier transfer is increased and the on-state current of the thin film transistor can be increased. Further, by providing the dual-gate thin film transistor as a thin film transistor which needs a large amount of current, the area of the transistor can be reduced; therefore the frame of the display device can be narrowed and a display region can be enlarged. In the pixel portion, a thin film transistor of which the on-state current is high and the off-state current is low is used as the switching element of each pixel, so that a display device with high contrast and high image quality can be achieved.

Note that this embodiment can be applied to any of the other embodiments.

[Embodiment 2]

In this embodiment, a thin film transistor which is different from that described in Embodiment 1 will be described with reference to FIGS. 5A and 5B.

Figure 5A:
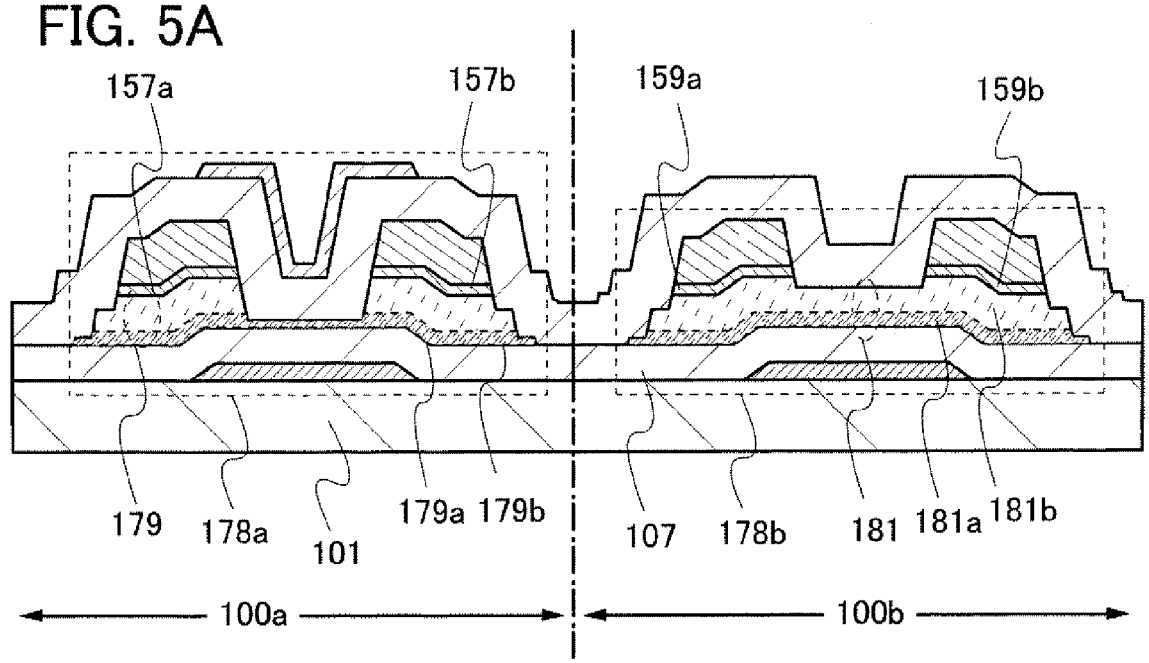
FIGS. 5A and 5B are cross-sectional views illustrating a display device according to an embodiment of the present invention.

In FIG. 5A, a thin film transistor 178a formed in a driver circuit 100a corresponds to the thin film transistor 164a in Embodiment 1 and a thin film transistor 178b formed in a pixel portion 100b corresponds to the thin film transistor 164b in Embodiment 1. The structures other than those described hereinafter are similar to those of the thin film transistors 164a and 164b.

In the thin film transistors 178a and 178b, semiconductor layers 179 and 181 each have a stacked-layer structure in which microcrystalline semiconductor regions 179a and 181a and amorphous semiconductor regions 179b and 181b are stacked, respectively. The amorphous semiconductor regions 179b and 181b are formed using amorphous silicon.

Here, a detailed structure of the semiconductor layers 179 and 181 is described. Here, FIG. 5B illustrates an enlarged view of a region between the gate insulating layer 107 and the impurity semiconductor layer 157a serving as a source or a drain region included in the thin film transistor 178a in FIG. 5A.

Amorphous silicon does not include a crystal grain having a diameter of greater than or equal to 1 nm and less than or equal to 10 nm, preferably greater than or equal to 1 nm and less than or equal to 5 nm. Amorphous silicon is a semiconductor having low order, compared to the amorphous semiconductor containing nitrogen included in the amorphous semiconductor region described in Embodiment 1. By forming the amorphous semiconductor region 179b with the use of amorphous silicon, the interface between the microcrystalline semiconductor region 179a and the amorphous semiconductor region 179b can be generally even. As illustrated in FIG. 5B, the substantially planarized interface between the microcrystalline semiconductor region 179a and the amorphous semiconductor region 179b may be uneven. However, the projection of the microcrystalline semiconductor region 179a has an obtuse angle, so that the microcrystalline semiconductor region 179a has little unevenness.

With such a structure, the off-state current of the thin film transistors 178a and 178b can be further reduced.

Accordingly, the frame of the display device described in this embodiment can be narrowed. In the pixel portion, a thin film transistor of which on-state current is high and off-state current is low is used as the switching element of each pixel, so that a display device with high contrast and high image quality can be achieved.

Note that this embodiment can be applied to any of the other embodiments.

[Embodiment 3]

In this embodiment, a thin film transistor which is different in the structure from that described in Embodiment 1 will be described with reference to FIGS. 6A and 6B.

Figure 6A:
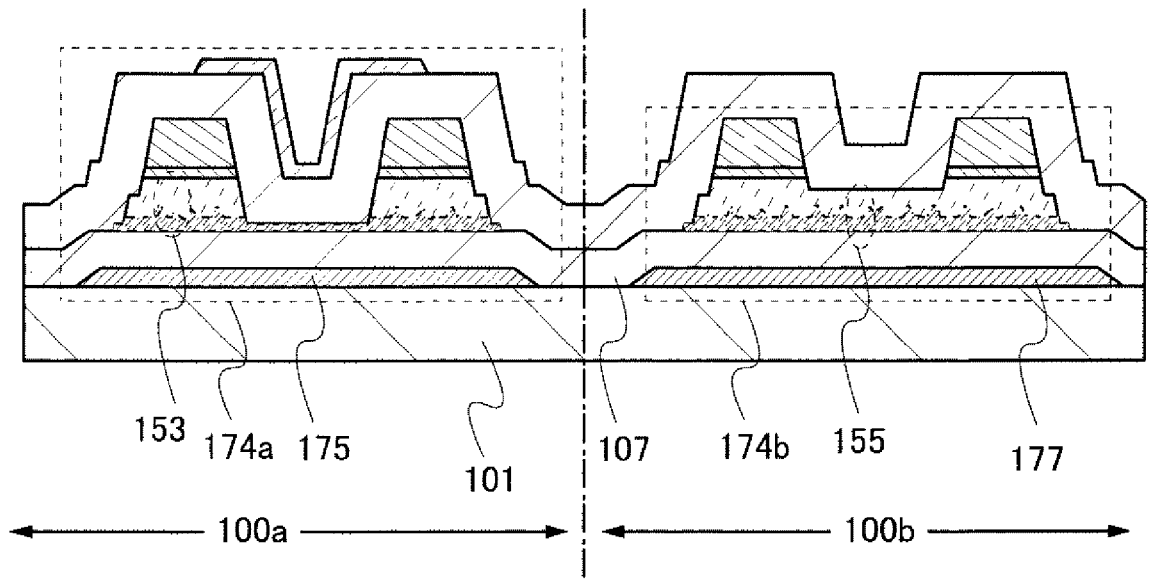
FIGS. 6A and 6B are cross-sectional views illustrating a display device according to an embodiment of the present invention.
Figure 6B:
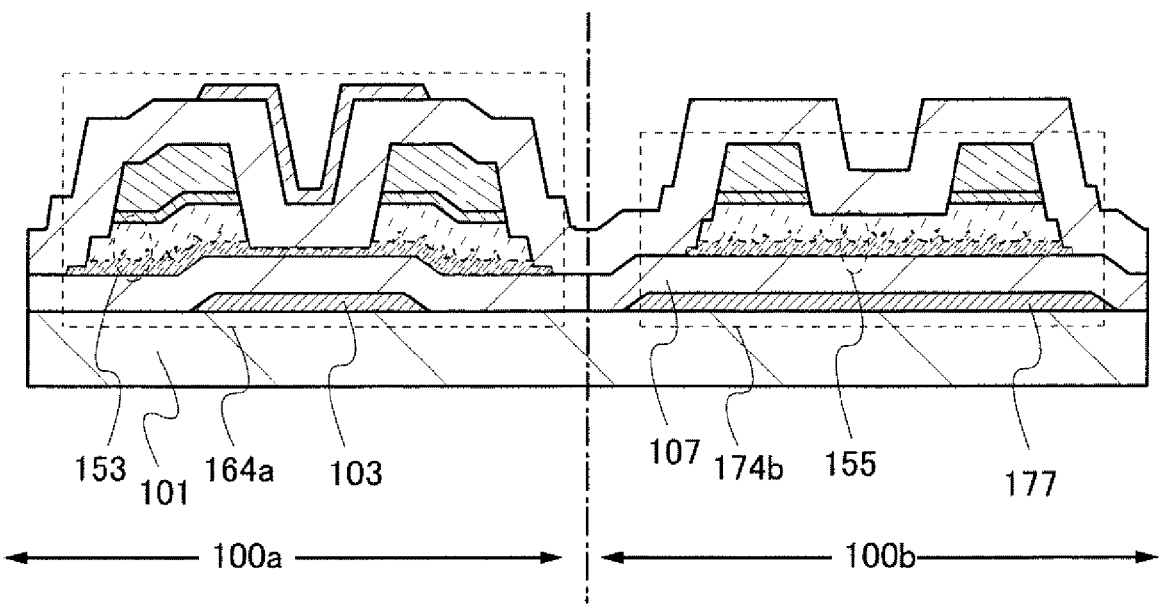

In FIG. 6A, a thin film transistor 174a formed in a driver circuit 100a corresponds to the thin film transistor 164a in Embodiment 1 and a thin film transistor 174b formed in a pixel portion 100b corresponds to the thin film transistor 164b in Embodiment 1.

In the thin film transistors 174a and 174b, each end portions of semiconductor layers 153 and 155 are positioned not outside gate electrodes 175 and 177 but over the gate electrodes 175 and 177, with a gate insulating layer 107 provided therebetween. With the structure of the thin film transistors 174a and 174b, in a display device including a backlight such as a liquid crystal display device, the gate electrodes 175 and 177 each serve as a light-blocking member with respect to light delivered to the semiconductor layers 153 and 155; therefore, it is possible to suppress light irradiation on the semiconductor layers 153 and 155 with light from the substrate side, such as light from a backlight. Therefore, the off-state current of the thin film transistors 174a and 174b can be reduced.

Note that the thin film transistor 174b included in the pixel portion 100b in FIG. 6A is formed at least in a pixel portion. That is, as illustrated in FIG. 6B, the driver circuit 100a can be formed using the thin film transistor 164a in which end portions of the semiconductor layer 153 are positioned outside the gate electrode 103 with the gate insulating layer 107 provided therebetween, and the pixel portion 100b can be formed using the thin film transistor 174b in which end portions of the semiconductor layer 155 are positioned over the gate electrode 177 with the gate insulating layer 107 provided therebetween. In the thin film transistor 174b in the pixel portion 100b, the gate electrode 177 serves as a light-blocking member with respect to light irradiated to the semiconductor layer 155; thus it can be possible to suppress light irradiation on the semiconductor layer 155 with light from the substrate side, such as light from a backlight. Therefore, the off-state current of the thin film transistor 174b in the pixel portion 100b can be reduced.

Accordingly, the frame of the display device described in this embodiment can be narrowed. In the pixel portion, a thin film transistor of which the on-state current is high and the off state current is low is used as the switching element of each pixel, so that a display device with high contrast and high image quality can be achieved.

Note that this embodiment can be applied to any of the other embodiments.

[Embodiment 4]

In this embodiment, a manufacturing method of the display device in FIGS. 1A and 1B will be described with reference to FIGS. 7A to 7C, FIGS. 8A and 8B, FIGS. 9A and 9B, and FIGS. 10A and 10B.

Figure 7A:
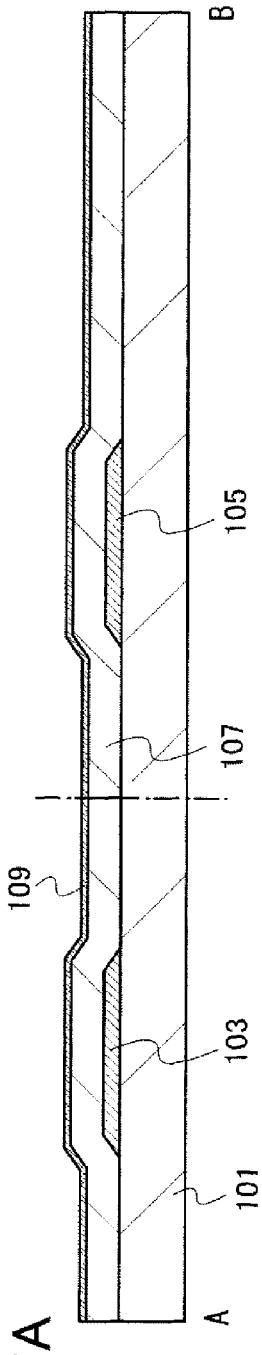
FIGS. 7A to 7C are cross-sectional views illustrating a method for manufacturing a display device according to an embodiment of the present invention.

As illustrated in FIG. 7A, gate electrodes 103 and 105 are formed over a substrate 101. Then, a gate insulating layer 107 and a microcrystalline semiconductor layer 109 which cover the gate electrodes 103 and 105 are formed.

As the substrate 101, the substrate 101 described in Embodiment 1 can be used as appropriate.

The gate electrodes 103 and 105 are formed using any of the materials used for the gate electrodes 103 and 105 described in Embodiment 1 as appropriate. The gate electrodes 103 and 105 can be formed in the following manner: a conductive layer is formed over the substrate 101 using the above-described material by a sputtering method or a vacuum evaporation method; a mask is formed over the conductive layer by a photolithography method, an inkjet method, or the like; and the conductive layer is etched using the mask. Further, the gate electrodes 103 and 105 can be formed by discharging a conductive nanopaste of silver, gold, copper, or the like over the substrate by an inkjet method and baking the conductive nanopaste. In order to improve adhesion between the gate electrode 103 and the substrate 101 and between the gate electrode 105 and the substrate 101, a nitride layer including any of the aforementioned metal materials may be provided between the substrate 101 and the gate electrodes 103 and 105. Here, a conductive layer is formed over the substrate 101 and then etched using a resist mask formed using a photomask.

Note that side surfaces of the gate electrodes 103 and 105 are preferably tapered. This is in order to prevent disconnection at a step portion because an insulating layer, a semiconductor layer, and a wiring layer which are formed over the gate electrodes 103 and 105 in subsequent steps. In order to form the side surfaces of the gate electrodes 103 and 105 into a tapered shape, etching may be performed while the resist mask is made to recede.

Through the step of forming the gate electrodes 103 and 105, a gate wiring (a scan line) and a capacitor wiring can also be formed at the same time. Note that a scan line means a wiring which selects a pixel, and a capacitor wiring means a wiring which is connected to one of electrodes of a storage capacitor in a pixel. However, without limitation thereto, the gate electrodes 103 and 105 and one or both of a gate wiring and a capacitor wiring may be formed separately.

The gate insulating layer 107 can be formed by a CVD method, a sputtering method, or the like using the material described in Embodiment 1. In the process of forming the gate insulating layer 107 by a CVD method, glow discharge plasma is generated by applying high-frequency power of 3 MHz to 30 MHz, typically 13.56 MHz or 27.12 MHz, or high-frequency power in the VHF band with a frequency greater than 30 MHz and approximately less than or equal to 300 MHz, typically 60 MHz. Alternatively, glow discharge plasma is generated by applying high-frequency power at a microwave frequency of 1 GHz or more. With the use of high-frequency power in the VHF band or at a microwave frequency, the deposition rate can be increased. Note that a pulsed oscillation by which high-frequency power is applied in a pulsed manner or a continuous oscillation by which high-frequency power is applied continuously may be applied. In addition, by superimposing high-frequency power in the HF band and high-frequency power in the VHF band on each other, unevenness of plasma in a large-sized substrate is also reduced, so that uniformity can be improved and the deposition rate can be increased. When the gate insulating layer 107 is formed using a microwave plasma CVD apparatus with a high frequency of 1 GHz or higher, the dielectric strength between the gate electrode and the drain and source electrodes can be improved, so that a highly reliable thin film transistor can be obtained.

Further, when a silicon oxide layer is formed as the gate insulating layer 107 by a CVD method using an organosilane gas, the crystallinity of a semiconductor layer which is formed later can be improved; thus, the on-state current and the field-effect mobility of a thin film transistor to be formed can be increased. As an organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

The microcrystalline semiconductor layer 109 is formed using a microcrystalline semiconductor layer typified by a microcrystalline silicon layer, a microcrystalline silicon-germanium layer, a microcrystalline germanium layer, or the like. The thickness of the microcrystalline semiconductor layer 109 is preferably greater than or equal to 3 nm and less than or equal to 100 nm, further preferably greater than or equal to 5 nm and less than or equal to 50 nm. In the case where the microcrystalline semiconductor layer 109 is too thin, the on-state current of the thin film transistor is reduced. While in the case where the microcrystalline semiconductor layer 109 is too thick, the off-state current of the thin film transistor is increased when the thin film transistor operates at a high temperature. For that reason, the thickness of the microcrystalline semiconductor layer 109 is set to greater than or equal to 3 nm and less than or equal to 100 nm, preferably greater than or equal to 5 nm and less than or equal to 50 nm, whereby the on-state current and the off-state current of the thin film transistor can be controlled.

In a reaction chamber of the plasma CVD apparatus, a deposition gas containing silicon or germanium is mixed with hydrogen, and the microcrystalline semiconductor layer 109 is formed by glow discharge plasma. Alternatively, the microcrystalline semiconductor layer 109 is formed by glow discharge plasma with a mixture of a deposition gas containing silicon or germanium, hydrogen, and a rare gas such as helium, neon, or krypton. Microcrystalline silicon, microcrystalline silicon germanium, microcrystalline germanium, or the like is formed using a mixed gas which is obtained by diluting the deposition gas containing silicon or germanium with hydrogen whose flow rate is 10 times to 2000 times, preferably 10 times to 200 times that of the deposition gas. The deposition temperature in that case is preferably higher than or equal to a room temperature and lower than or equal to 300° C., further preferably higher than or equal to 200° C. and lower than or equal to 280° C.

Typical examples of the deposition gas containing silicon or germanium are $SiH_4$, $Si_2H_6$, $GeH_4$, and $Ge_2H_6$.

When the gate insulating layer 107 is formed using a silicon nitride layer, an amorphous semiconductor region is likely to be formed at an early stage of deposition of the microcrystalline semiconductor layer 109, so that crystallinity of the microcrystalline semiconductor layer 109 is low and electric characteristics of the thin film transistor are poor. Therefore, when the gate insulating layer 107 is formed using a silicon nitride layer, the microcrystalline semiconductor layer 109 is preferably deposited under the condition that the dilution rate of the deposition gas containing silicon or germanium is high or under the low temperature condition. Specifically, the high dilution rate condition in which the flow rate of hydrogen is 200 times to 2000 times, further preferably 250 times to 400 times that of the deposition gas containing silicon or germanium is preferable. In addition, the low temperature condition in which the temperature for deposition of the microcrystalline semiconductor layer 109 is higher than or equal to 200° C. and lower than or equal to 250° C. is preferable. When the high dilution rate condition or the low temperature condition is employed, early nuclear generation density is increased, an amorphous component over the gate insulating layer 107 is reduced, and crystallinity of the microcrystalline semiconductor layer 109 is improved.

When a rare gas such as helium, argon, neon, krypton, or xenon is used as a source gas for the microcrystalline semiconductor layer 109, the deposition rate of the microcrystalline semiconductor layer 109 is increased. Moreover, since the deposition rate is increased, the amount of impurities mixed in the microcrystalline semiconductor layer 109 is reduced; thus, the crystallinity of the microcrystalline semiconductor layer 109 can be improved. Accordingly, the on-state current and the field-effect mobility of the thin film transistor are increased and throughput of the thin film transistor can be increased.

When the microcrystalline semiconductor layer 109 is formed, glow discharge plasma is generated by applying high-frequency power with a frequency of 3 MHz to 30 MHz, typically, 13.56 MHz or 27.12 MHz in the HF band, or high-frequency power with a frequency greater than 30 MHz and approximately less than or equal to 300 MHz in the VHF band, typically 60 MHz. Alternatively, glow discharge plasma is generated by applying high-frequency power at a microwave frequency of 1 GHz or higher. Note that a pulsed oscillation by which high-frequency power is applied in a pulsed manner or a continuous oscillation by which high-frequency power is applied continuously may be applied. In addition, by superimposing high-frequency power in the HF band and high-frequency power in the VHF band on each other, unevenness of plasma in a large-sized substrate is also reduced, so that uniformity can be improved and the deposition rate can be increased.

Note that before the microcrystalline semiconductor layer 109 may be formed, impurity elements in a treatment chamber of a CVD apparatus are removed by introducing a deposition gas containing silicon or germanium while exhausting gas in the treatment chamber, so that the amount of impurities in the gate insulating layer 107 and the microcrystalline semiconductor layer 109 of the thin film transistor formed later can be reduced. Thus, electric characteristics of the thin film transistor can be improved.

Figure 7B:
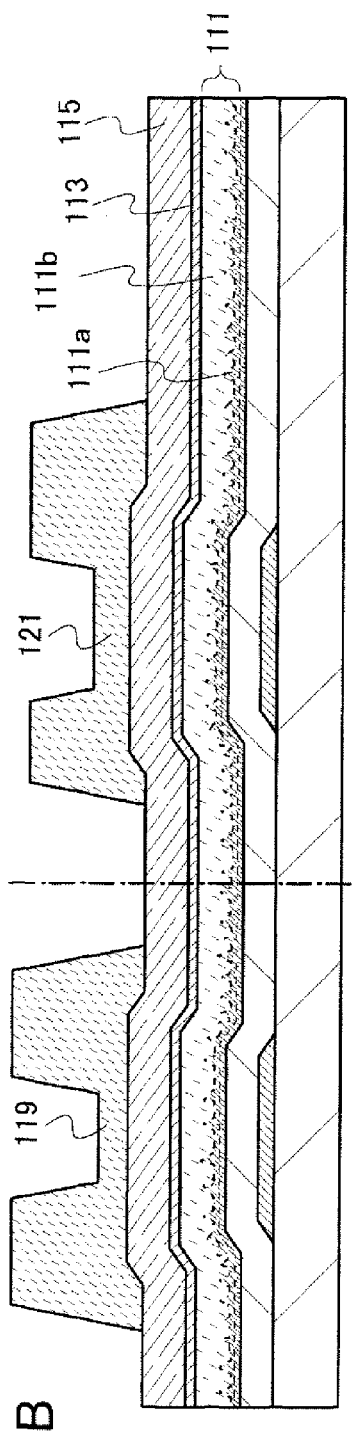

Next, as illustrated in FIG. 7B, a semiconductor layer 111 is deposited over the microcrystalline semiconductor layer 109. The semiconductor layer 111 includes a microcrystalline semiconductor region 111a and an amorphous semiconductor region 111b. Then, an impurity semiconductor layer 113 and a conductive layer 115 are formed over the semiconductor layer 111. Then, resist masks 119 and 121 are formed over the conductive layer 115.

The semiconductor layer 111 which includes the microcrystalline region 111a and the amorphous semiconductor region 111b can be formed under a condition that crystals are partly grown using the microcrystalline semiconductor layer 109 as a seed crystal (a condition that crystal growth is suppressed).

In the treatment chamber of the plasma CVD apparatus, a deposition gas containing silicon or germanium is mixed with hydrogen, and a gas containing nitrogen, and the semiconductor layer 111 is formed by glow discharge plasma. Examples of the gas containing nitrogen are ammonia, nitrogen, nitrogen fluoride, nitrogen chloride, chloroamine, fluoroamine, and the like. Glow discharge plasma can be generated as in the case of the microcrystalline semiconductor layer 109.

In this case, a flow rate ratio of the deposition gas containing silicon or germanium to hydrogen is the same as that for forming a microcrystalline semiconductor layer as in the case of forming the microcrystalline semiconductor layer 109, and a gas containing nitrogen is used for the source gas, whereby crystal growth can be further suppressed compared to the deposition condition of the microcrystalline semiconductor layer 109. Specifically, at an early stage of deposition of the semiconductor layer 111, since a gas containing nitrogen is included in the source gas, the crystal growth is partly suppressed; therefore, a conical or pyramidal microcrystalline semiconductor region grows, and an amorphous semiconductor region is deposited. Further, at a middle stage and a later stage of deposition, crystal growth in the conical or pyramidal microcrystalline semiconductor region stops and only the amorphous semiconductor region is formed. As a result, the microcrystalline semiconductor region 111a and the amorphous semiconductor region 111b which is formed with a well-ordered semiconductor layer having fewer defects and a steep tail slope in a level at a band edge in the valence band can be formed in the semiconductor layer 111.

Here, a typical example of a condition for forming the semiconductor layer 111 is as follows: the flow rate of hydrogen is 10 times to 2000 times, preferably, 10 times to 200 times that of the deposition gas containing silicon or germanium. Note that in a typical example of a condition for forming a normal amorphous semiconductor layer, the flow rate of hydrogen is 0 times to 5 times that of the deposition gas containing silicon or germanium.

When a rare gas such as helium, neon, argon, xenon, or krypton is introduced into the source gas of the semiconductor layer 111, whereby the deposition rate of the semiconductor layer 111 can be increased.

The thickness of the semiconductor layer 111 is preferably greater than or equal to 50 nm and less than or equal to 350 nm, further preferably greater than or equal to 120 nm and less than or equal to 250 nm.

Here, the semiconductor layer 111 including the microcrystalline semiconductor region 111a and the amorphous semiconductor region 111b are formed using the source gas including a gas containing nitrogen is included, of the semiconductor layer 111. Alternatively, the semiconductor layer 111 may be formed in the following manner: a surface of the microcrystalline semiconductor layer 109 is exposed to a gas containing nitrogen so that nitrogen is adsorbed to the surface of the microcrystalline semiconductor layer 109; and then the semiconductor layer 111 including the microcrystalline semiconductor region 111a and the amorphous semiconductor region 111b is formed using a deposition gas containing silicon or germanium and hydrogen as the source gas.

The impurity semiconductor layer 113 is formed by glow discharge plasma with a mixture of a deposition gas containing silicon, hydrogen, and phosphine (diluted with hydrogen or silane) in the treatment chamber of the plasma CVD apparatus. Amorphous silicon to which phosphorus is added or microcrystalline silicon to which phosphorus is added is formed by diluting the deposition gas including silicon with hydrogen. Note that in the case of manufacturing a p-channel thin film transistor, the impurity semiconductor layer 113 is formed by glow discharge plasma using diborane instead of phosphine.

The conductive layer 115 can be formed using a material similar to that of the wirings 161a, 161b, 163a, and 163b described in Embodiment 1 as appropriate. The conductive layer 115 is formed by a CVD method, a sputtering method, or a vacuum evaporation method. Alternatively, the conductive layer 115 may be formed by discharging a conductive nanopaste of silver, gold, copper, or the like by a screen printing method, an inkjet method, or the like and baking the conductive nanopaste.

The resist masks 119 and 121 are formed by a second photolithography process. The resist masks 119 and 121 each have two regions with different thicknesses. Here, the thickness of a region which covers a wiring of each thin film transistor is made to be different from the thickness of a channel formation region. Further, the thickness of a resist which covers a channel formation region of a thin film transistor in a driver circuit is made to be different from the thickness of a resist which covers a channel formation region of a thin film transistor in a pixel portion. Typically, the descending order of thickness is as follows: the region which covers a wiring of each thin film transistor, the channel formation region of the thin film transistor in the pixel portion, and the channel formation region of the thin film transistor in the driver circuit.

Such a resist mask can be formed using a multi-tone mask. The multi-tone mask is preferably used because the number of photomasks used and the number of manufacturing steps can be reduced. In this embodiment, the multi-tone mask can be used in a step of forming patterns of the microcrystalline semiconductor layer 109 and the semiconductor layer 111, a step of separating the semiconductor into a source region and a drain region, an etching step of the channel formation region of the thin film transistor in the driver circuit, and an etching step of the channel formation region of the thin film transistor in the pixel portion.

A multi-tone mask is a mask capable of light exposure with multi-level light quantity. Typically, light exposure is performed with three or more levels of light quantity to provide an exposed region, a half-exposed region, and an unexposed region. With the use of a multi-tone mask, by one light exposure and development step, a resist mask with plural thicknesses (three kinds of thicknesses in this embodiment) can be formed. Therefore, with the use of a multi-tone mask, the number of photomasks can be reduced.

FIGS. 11A1 and 11B1 are cross-sectional views of typical multi-tone masks. FIG. 11A1 illustrates a gray-tone mask 280, and FIG. 11B1 illustrates a half-tone mask 285.

The gray-tone mask 280 illustrated in FIG. 11A1 includes a light-blocking portion 282 formed using a light-blocking layer on a light-transmitting substrate 281, and a diffraction grating portion 283 provided with a pattern of the light-blocking layer.

The diffraction grating portion 283 has slits, dots, mesh, or the like provided at intervals which are less than or equal to the resolution limit of light used for the exposure, and thus control the light transmittance. Note that the slits, dots, or mesh provided at the diffraction grating portion 283 may be provided periodically or non-periodically.

For the light-transmitting substrate 281, quartz or the like can be used. The light-blocking layer for forming the light-shielding portion 282 and the diffraction grating portion 283 is formed using chromium, chromium oxide, or the like.

In the case where the gray-tone mask 280 is irradiated with light for exposure, as illustrated in FIG. 11A2, the transmittance in a region overlapping with the light-blocking portion 282 is 0%, and the transmittance in a region where neither the light-blocking portion 282 nor the diffraction grating portion 283 is provided is 100%. Further, the transmittance at the diffraction grating portion 283 is approximately in the range of 10% to 70%, which can be adjusted by the intervals of slits, dots, or mesh, or the like of the diffraction grating.

The half-tone mask 285 illustrated in FIG. 11B1 includes a half-light-transmitting portion 287 which is formed using a half-light-transmitting layer and a light-blocking portion 288 which is formed using a light-blocking layer, over a light-transmitting substrate 286.

The half-light-transmitting portion 287 can be formed using a layer of MoSiN, MoSi, MoSiO, MoSiON, CrSi, or the like. The light-blocking portion 288 may be formed using a material which is similar to that of the light-blocking layer of the gray-tone mask, and is preferably formed using chromium, chromium oxide, or the like.

In the case where the half-tone mask 285 is irradiated with light for exposure, as illustrated in FIG. 11B2, the transmittance in a region overlapping with the light-blocking portion 288 is 0%, and the transmittance in a region where neither the light-blocking portion 288 nor the half-light-transmitting portion 287 is provided is 100%. Further, the transmittance at the half-light-transmitting portion 287 is approximately in the range of 10% to 70%, which can be adjusted by the kind of material, the film thickness, or the like to be used.

By light exposure using the multi-tone mask and development, a resist mask which includes regions having different thicknesses can be formed.

Figure 7C:
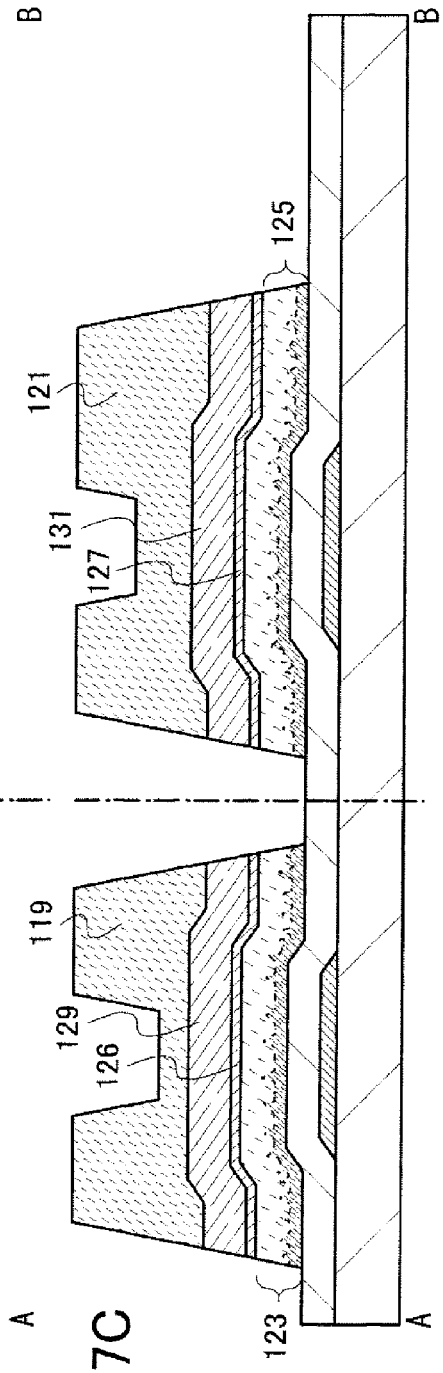

Next, with the use of the resist masks 119 and 121, the microcrystalline semiconductor layer 109, the semiconductor layer 111, the impurity semiconductor layer 113, and the conductive layer 115 are etched (see FIG. 7C). Through this step, the microcrystalline layer 109, the semiconductor layer 111, the impurity semiconductor layer 113, and the conductive layer 115 are separated for each element to form semiconductor layers 123 and 125, impurity layers 126 and 127, and conductive layers 129 and 131. Note that the semiconductor layer 123 is part of the microcrystalline semiconductor layer 109 and the semiconductor layer 111, and includes a microcrystalline semiconductor region 123a and an amorphous semiconductor region 123b. The semiconductor layer 125 is part of the microcrystalline semiconductor layer 109 and the semiconductor layer 111, and includes a microcrystalline semiconductor region 125a and an amorphous semiconductor region 125b (see FIG. 1C).

Next, the resist masks 119 and 121 are recessed to form resist masks 133a and 133b which are separated from each other over the channel formation region, and a resist mask 135 which is not separated over the channel formation region. Ashing using oxygen plasma may be performed in order that the resist mask is made to recede. The resist masks 119 and 121 are subjected to ashing so as to be separated from each other over the gate electrode of the thin film transistor in the driver circuit; thus the resist masks 133a, 133b, and 135 can be formed (see FIG. 8A). Here, in order to separate the impurity semiconductor layer of the thin film transistor in the driver circuit and further etching partly the semiconductor layer 123 in the subsequent etching step, the resist masks covering the thin film transistor in the driver circuit are separated from each other.

Next, the conductive layer 129 and the impurity semiconductor layer 126 are etched with the use of the resist masks 133a and 133b, whereby conductive layers 145a and 145b and a pair of impurity semiconductor layers 141a and 141b are formed. In addition, part of the semiconductor layer 123 is etched, so that a semiconductor layer 137 with a recessed portion is formed. By the etching step, end portions of the semiconductor layer 125, the impurity semiconductor layer 127, and the conductive layer 131 which are not covered with the resist mask 135 are etched in the pixel portion, so that a semiconductor layer 139, an impurity semiconductor layer 143, and a conductive layer 147 are formed (see FIG. 8B).

Dry etching or wet etching can be used for etching the conductive layers 129 and 131.

Figure 9A:
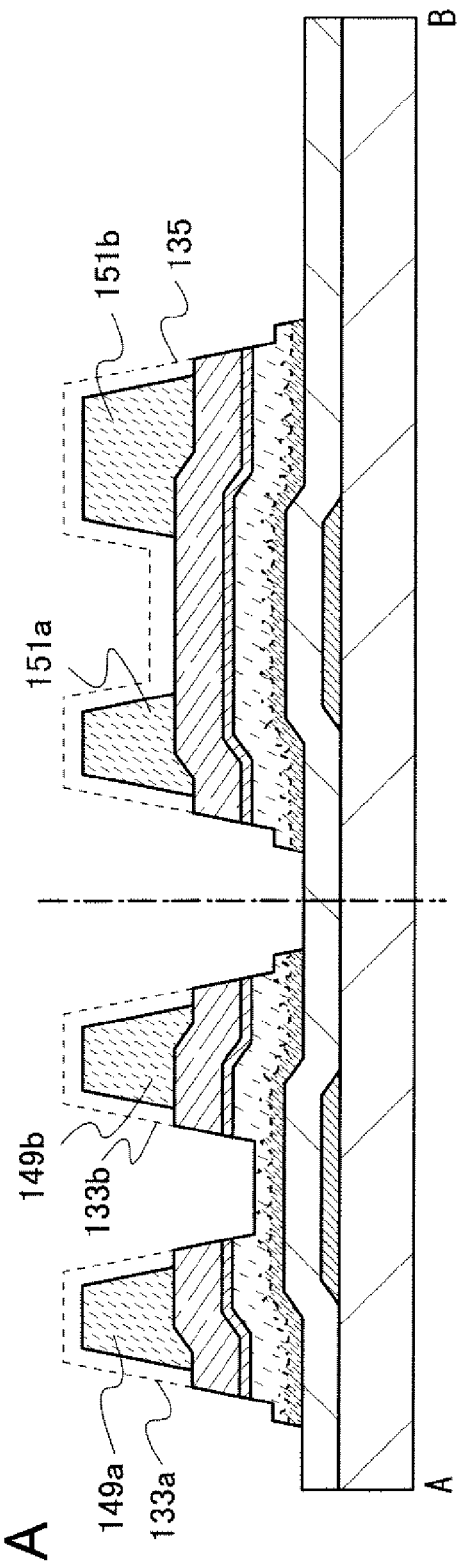
FIGS. 9A and 9B are cross-sectional views illustrating a method for manufacturing a display device according to an embodiment of the present invention.
Figure 9B:
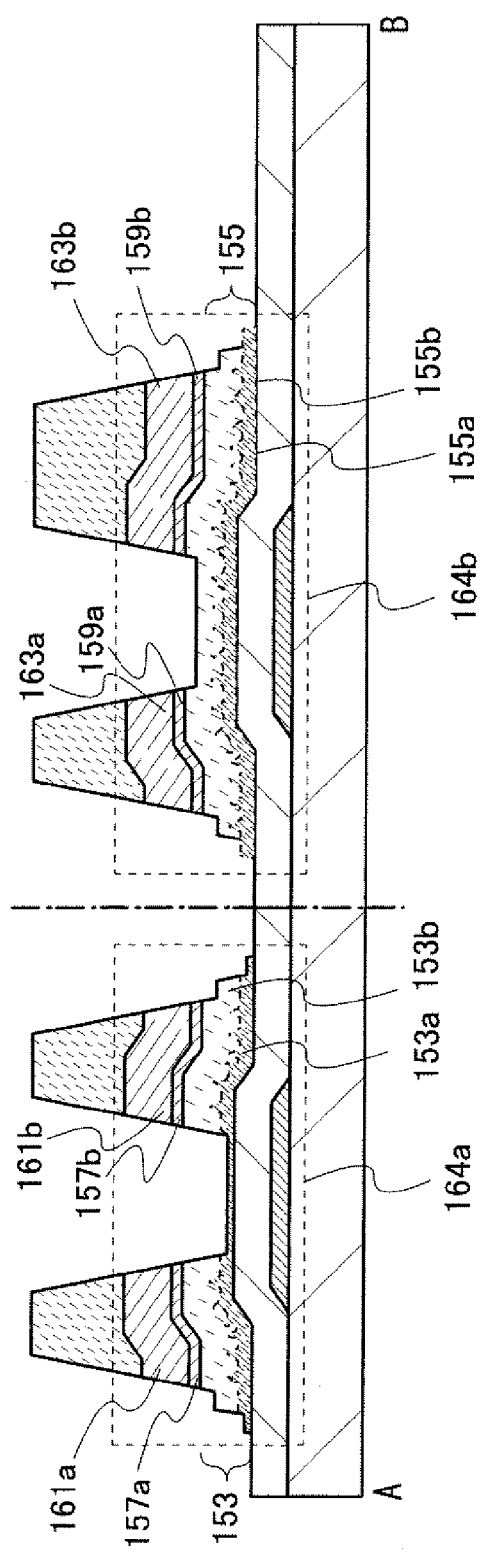

Next, as illustrated in FIG. 9A, the resist masks 133a, 133b, and 135 are recessed to form resist masks 149a and 149b which are narrower than the resist masks 133a and 133b, and form resist masks 151a and 151b which are separated from each other over the channel formation region. Ashing using oxygen plasma may be performed in order that the resist mask is made to recede. The resist masks 133a, 133b, and 135 are subjected to ashing so as to be separated from each other over the gate electrode of the thin film transistor in the pixel portion; thus, the resist masks 149a, 149b, 151a, and 151b can be formed. Here, in order to separate the impurity semiconductor layer of the thin film transistor in the pixel portion in the subsequent etching step, the resist masks covering the thin film transistor in the pixel portion are separated from each other.

Next, the conductive layer 147 and the impurity semiconductor layer 143 are etched with the use of the resist masks 151a and 151b, whereby wirings 163a and 163b which serve as a source electrode and a drain electrode and a pair of conductive layers 159a and 159b which serve as a source region and a drain region are formed. Note that either the wiring 163a or the wiring 163b serves not only as a source or drain electrodes but also as a signal line. However, without limitation thereto, a signal line may be provided separately from the source and drain electrodes. In addition, part of the semiconductor layer 139 is etched, so that a semiconductor layer 155 with a recessed portion is formed. Here, the semiconductor layer 139 is etched so that an amorphous semiconductor region 155b is exposed; therefore, the semiconductor layer 155 in which the amorphous semiconductor region 155b is exposed in a region where the amorphous semiconductor region 155b overlaps with the gate electrode is formed.

By the etching step, end portions of the semiconductor layer 137, the impurity semiconductor layers 141a and 141b, and the conductive layers 145a and 145b which are not covered with the resist masks 149a and 149b are etched in the driver circuit, a semiconductor layer 153, a pair of impurity semiconductor layers 157a and 157b which serve as a source and drain region, and a pair of wirings 161a and 161b which serve as a source and drain region are formed. Note that either the wiring 161a or the wiring 161b serves not only as a source or drain electrodes but also as a signal line. However, without limitation thereto, a signal line may be provided separately from the source and drain electrodes. When the semiconductor layer 153 is etched so that a microcrystalline semiconductor region 153a is exposed, in the semiconductor layer 153, the microcrystalline semiconductor region 153a and an amorphous semiconductor region 153b are stacked in a region covered with the wirings 161a and 161b, and the microcrystalline semiconductor region 153a is exposed in a region that is not covered with the wirings 161a and 161b and overlaps with the gate electrode (see FIG. 9B).

The semiconductor layer 153 includes the microcrystalline semiconductor region 153a and the amorphous semiconductor region 153b. The semiconductor layer 155 includes the microcrystalline semiconductor region 155a and the amorphous semiconductor region 155b.

Here, dry etching is performed in the etching step, so that end portions of the wirings 161a and 161b and end portions of the impurity semiconductor layer 157a and 157b are aligned with each other, and end portions of the wirings 163a and 163b and end portions of the impurity semiconductor layer 159a and 159b are aligned with each other. On the other hand, when the conductive layers 145a, 145b, and 147 are subjected to wet etching and the impurity semiconductor layers 141a, 141b, and 143 are subjected to dry etching, so that end portions of the wirings 161a and 161b and end portions of the impurity semiconductor layers 157a and 157b are not aligned with each other, and end portions of the wirings 163a and 163b and the end portions of the impurity semiconductor layer 159a and 159b are not aligned. Therefore, in the cross section, end portions of the wirings 161a, 161b, 163a, and 163b are positioned inside the end portions of the impurity semiconductor layers 157a, 157b, 159a, and 159b.

Next, dry etching may be performed. Condition of dry etching is set so that exposed regions of the microcrystalline semiconductor region 153a and the amorphous semiconductor region 155b are not damaged and the etching rate with respect to the microcrystalline semiconductor region 153a and the amorphous semiconductor region 155b is low. In other words, conditions which give almost no damage to the exposed surfaces of the microcrystalline semiconductor region 153a and the amorphous semiconductor region 155b and hardly reduce the thickness of the exposed region of the microcrystalline semiconductor region 153a and the amorphous semiconductor region 155b is applied. As an etching gas, $Cl_2$, $CF_4$, $N_2$, or the like is typically used. There is no particular limitation on an etching method and an inductively coupled plasma (ICP) method, a capacitively coupled plasma (CCP) method, an electron cyclotron resonance (ECR) method, a reactive ion etching (RIE) method, or the like can be used.

Next, a surface of the microcrystalline semiconductor region 153a and the amorphous semiconductor region 155b may be subjected to plasma treatment typified by water plasma treatment, ammonia plasma treatment, nitrogen plasma treatment, or the like.

The water plasma treatment can be performed by generating plasma using a gas containing water as its main component typified by water vapor ($H_2O$ vapor), introduced into the reaction space. Then, the resist masks 149a, 149b, 151a, and 151b are removed. Note than the resist masks can be removed before dry etching.

As described above, after the microcrystalline semiconductor region 153a and the amorphous semiconductor region 155b are formed, dry etching is further performed under such a condition that the microcrystalline semiconductor region 153a and the amorphous semiconductor region 155b are not damaged, whereby an impurity such as a residue existing on the exposed surface of the microcrystalline semiconductor region 153a and the amorphous semiconductor region 155b can be removed. Further, by performing water plasma treatment is performed after dry etching, a residue of the resist mask can also be removed. By performing the plasma treatment, insulation between the source region and the drain region can be ensured, and thus, in a thin film transistor which is completed, the off-state current can be reduced, and variation in electric characteristics can be reduced.

Through the above-described steps. the thin film transistor 164a and the thin film transistor 164b can be manufactured. In addition, a thin film transistor in which a channel formation region is formed using a microcrystalline semiconductor layer can be manufactured with the use of fewer masks. Further, a thin film transistor with small off-state current, large on-state current, and high field-effect mobility can be manufactured with high productivity.

Figure 10A:
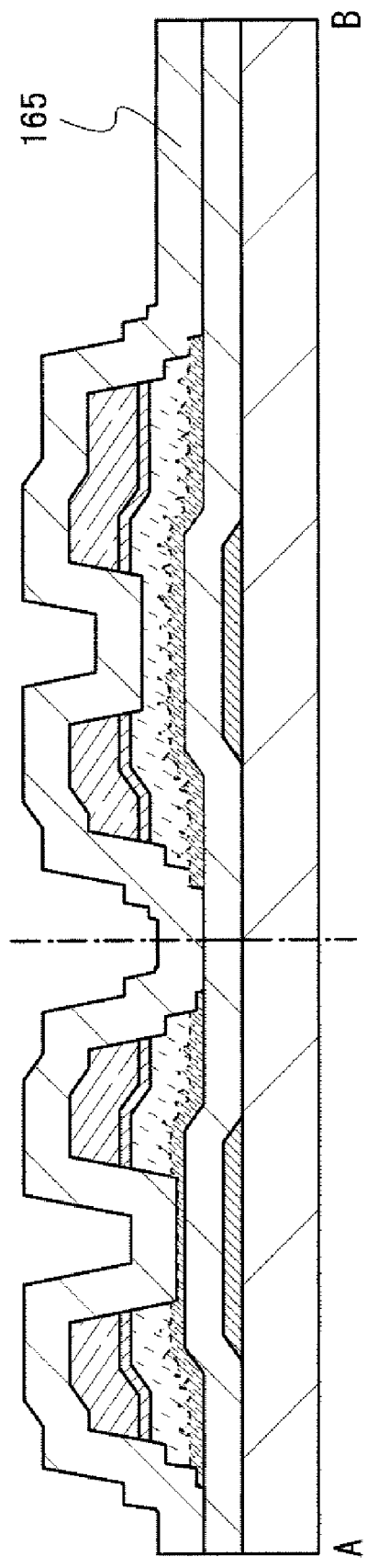
FIGS. 10A and 10B are cross-sectional views illustrating a method for manufacturing a display device according to an embodiment of the present invention.

Next, as shown in FIG. 10A, an insulating layer 165 is fouled. The insulating layer 165 can be formed in a manner similar to that of the gate insulating layer 107.

Then, an opening is formed in the insulating layer 165 with the use of resist masks formed by a photolithography process. After that, a back-gate electrode 167 is formed in the driver circuit and a pixel electrode 169 is formed in the pixel portion (see FIG. 10B).

The back-gate electrode 167 and the pixel electrode 169 can be formed in the following manner: a thin film is formed using the materials described in Embodiment 1 by a sputtering method, and the film is etched using a resist mask that is formed by a photolithography process. Alternatively, a conductive composition including a conductive high molecule is applied or printed, and baked to form the back-gate electrode 167 and the pixel electrode 169.

Through the above-described process, an element substrate which can be used for the display device illustrated in FIGS. 1A and 1B can be manufactured.

Note that this embodiment can be applied to any of the other embodiments.

[Embodiment 5]

In this embodiment, a method for manufacturing the thin film transistor described in Embodiment 2 will be described with reference to FIGS. 7A to 7C.

In a manner similar to that of Embodiment 4, gate electrode layers 103 and 105 are formed over a substrate 101. Then, a gate insulating layer 107 is formed over the gate electrode layers 103 and 105. After that, a microcrystalline semiconductor layer 109 is formed over the gate insulating layer (see FIG. 7A).

Figure 10B:
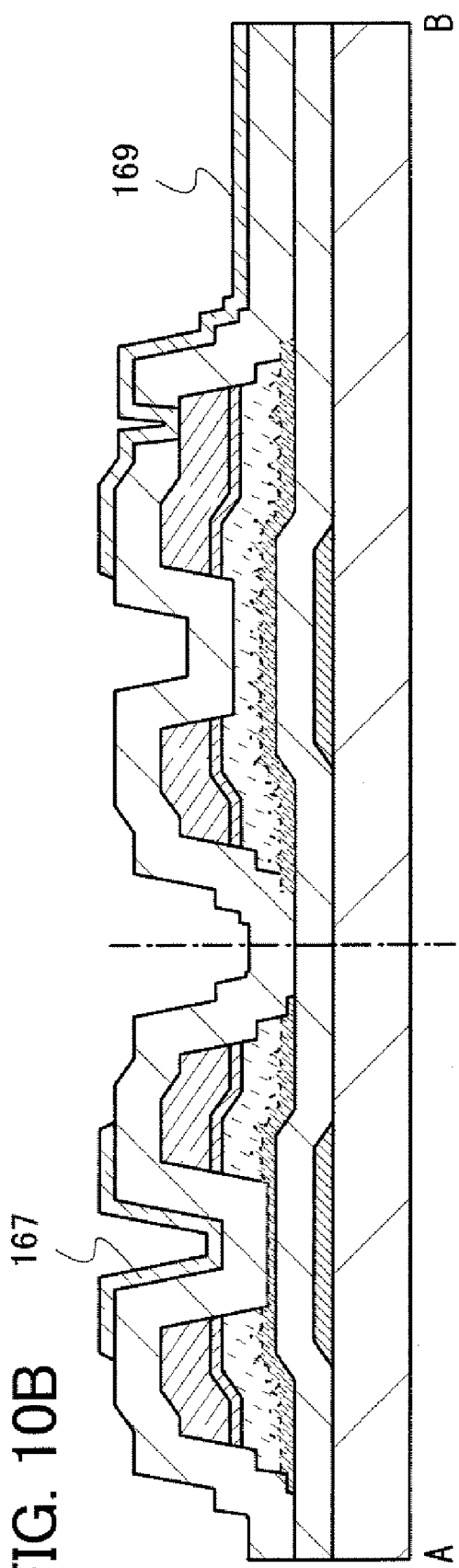

Next, in this embodiment, an amorphous semiconductor layer is formed over the microcrystalline semiconductor layer 109, and as illustrated in FIG. 10B, an impurity semiconductor layer 113 and a conductive layer 115 are formed over the amorphous semiconductor layer.

As a deposition condition of an amorphous semiconductor in this embodiment, in a reaction chamber of the plasma CVD apparatus, a deposition gas containing silicon or germanium is mixed with hydrogen, and the amorphous semiconductor layer is formed by glow discharge plasma. The amorphous semiconductor layer can be formed using a mixed gas which is obtained by diluting the deposition gas containing silicon or germanium with hydrogen whose flow rate is 0 times to 10 times, preferably 1 time to 5 times as high as than that of the deposition gas containing silicon or germanium.

Figure 5B:
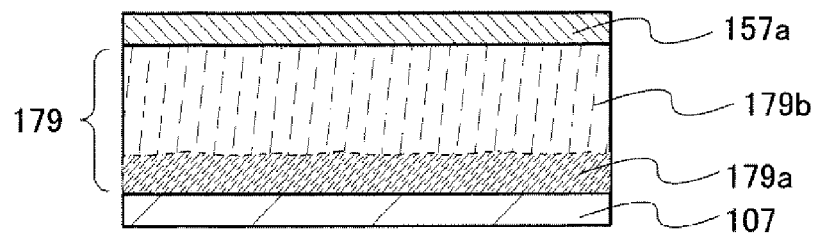

After the amorphous semiconductor layer is formed, the thin film transistors 178a and 178h illustrated in FIGS. 5A and 5B can be formed through the same process as in Embodiment 4.

Note that this embodiment can be applied to any of the other embodiments.

[Embodiment 6]

Through the above-described steps of Embodiments 1 to 5. a thin film transistor is manufactured, and a semiconductor device having a display function (also referred to as a display device) can be manufactured using the thin film transistor in a pixel portion and further in a driver circuit. Further, part or whole of a driver circuit can be formed over the same substrate as a pixel portion, using a thin film transistor, whereby a system-on-panel can be obtained.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Further, a display medium whose contrast is changed by an electric effect, such as electronic ink, can be used.

In addition, the display device includes a panel in which the display element is sealed, and a module in which an IC including a controller or the like is mounted on the panel. Further, an element substrate, which corresponds to one embodiment before the display element is completed in a manufacturing process of the display device, is provided with a means for supplying current to the display element in each of a plurality of pixels. Specifically, the element substrate may be in a state in which only a pixel electrode of the display element is provided, a state after a conductive film to be a pixel electrode is formed and before the pixel electrode is formed by etching the conductive film, or any other states.

Note that a display device in this specification is referred to as an image display device or a light source (including a lighting device). Further, the display device includes the following modules in its category: a module including a connector such as a flexible printed circuit (FPC), a tape automated bonding (TAB) tape, or a tape carrier package (TCP) attached; a module having a TAB tape or a TCP which is provided with a printed wiring board at the end thereof; and a module having an integrated circuit (IC) which is directly mounted on a display element by a chip on glass (COG) method.

The appearance and a cross section of a liquid crystal display panel which is an embodiment of a semiconductor device will be described with reference to FIGS. 16A1, 16A2, and 16B. FIGS. 16A1 and 16A2 are top views of panels in which highly reliable thin film transistors 4010 and 4011 each including a microcrystalline semiconductor layer formed over a first substrate 4001 which is described in any of the above embodiments, and a liquid crystal element 4013 are sealed between the first substrate 4001 and a second substrate 4006 with a sealant 4005. FIG. 16B is a cross-sectional view taken along line M-N of FIGS. 16A1 and 16A2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. Moreover, a signal line driver circuit 4003, which is formed using a single crystal semiconductor layer or a polycrystalline semiconductor layer over a substrate prepared separately, is provided in a region different from the region surrounded by the sealant 4005 over the first substrate 4001.

Note that the connection method of a driver circuit which is separately formed is not particularly limited, and a COG method, a wire bonding method, a TAB method, or the like can be used. FIG. 16A1 illustrates an example in which the signal line driver circuit 4003 is mounted by a COG method, and FIG. 16A2 illustrates an example in which the signal line driver circuit 4003 is mounted by a TAB method.

The pixel portion 4002 and the scan line driver circuit 4004 which are provided over the first substrate 4001 include a plurality of thin film transistors. FIG. 16B illustrates the thin film transistor 4010 included in the pixel portion 4002 and the thin film transistor 4011 included in the scan line driver circuit 4004 as an example. Over the thin film transistors 4010 and 4011, insulating films 4020 and 4021 are provided.

The thin film transistor which is described in any of Embodiments 1 to 5 can be applied to each of the thin film transistors 4010 and 4011.

A pixel electrode 4030 included in the liquid crystal element 4013 is electrically connected to the thin film transistor 4010. A counter electrode 4031 of the liquid crystal element 4013 is formed on the second substrate 4006. The liquid crystal element 4013 corresponds to a region where the pixel electrode 4030, the counter electrode 4031, and the liquid crystal layer 4008 overlap with each other. Note that the pixel electrode 4030 and the counter electrode 4031 are provided with an insulating film 4032 and an insulating film 4033 respectively which each serve as an alignment film, and the liquid crystal layer 4008 is sandwiched between the pixel electrode 4030 and the counter electrode 4031 with the insulating films 4032 and 4033 provided therebetween.

Note that the first substrate 4001 and the second substrate 4006 can be formed of glass, metal (typically, stainless steel), ceramic, or plastic. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

A spacer 4035 is a columnar spacer which is obtained by selective etching of an insulating film and provided in order to control the distance (a cell gap) between the pixel electrode 4030 and the counter electrode 4031. Alternatively, a spherical spacer may be used. The counter electrode 4031 is electrically connected to a common potential line formed over the substrate where the thin film transistor 4010 is formed. The counter electrode 4031 and the common potential line can be electrically connected to each other through conductive particles arranged between the pair of substrates using the common connection portion. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while the temperature of cholesteric liquid crystal is increased. Since the blue phase is only generated within an narrow range of temperature, a liquid crystal composition containing a chiral agent at 5 wt % or more is used for the liquid crystal layer 4008 in order to improve the temperature range. The liquid crystal composition including a liquid crystal exhibiting a blue phase and a chiral agent has a short response time of less than or equal to 1 msec and is optically isotropic; therefore, alignment treatment is not necessary and viewing angle dependence is small.

An embodiment of the present invention can also be applied to a reflective liquid crystal display device or a semi-transmissive liquid crystal display device, in addition to a transmissive liquid crystal display device.

Although a polarizing plate is provided on the outer surface of the substrate (on the viewer side) and a coloring layer and an electrode layer used for a display element are sequentially provided on the inner surface of the substrate in the liquid crystal display device of this embodiment, the polarizing plate may be provided on the inner surface of the substrate. The stacked structure of the polarizing plate and the coloring layer is not limited to that in this embodiment and may be set as appropriate depending on materials of the polarizing plate and the coloring layer or conditions of the manufacturing process. Further, a light-blocking film functioning as a black matrix may be provided.

In order to reduce surface roughness of the thin film transistor and to improve reliability of the thin film transistor, the thin film transistor obtained in any of the above embodiments is covered with the insulating films (the insulating film 4020 and the insulating film 4021) serving as an inorganic insulating film or a planarizing insulating film.

The insulating film 4021 is formed as the planarizing insulating film. As the insulating film 4021, an organic material having heat resistance such as polyimide, acrylic, benzocyclobutene, polyamide, or epoxy can be used. The insulating film 4021 can be formed using a heat-resistant organic material such as an acrylic resin, polyimide, a benzocyclobutene-based resin, polyamide, or an epoxy resin. Note that the insulating film 4021 may be formed by stacking a plurality of insulating films formed using any of these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

The formation method of the insulating film 4021 is not limited to a particular method, and the following method can be used depending on the material: a sputtering method, an SOG method, a spin coating method, a dipping method, a spray coating method, a droplet discharge method (such as an inkjet method, screen printing, offset printing, or the like), or the like. Further, the insulating film 4021 can be formed with a doctor knife, a roll coater, a curtain coater, a knife coater, or the like.

The counter electrode 4031 can be formed in a similar manner to the pixel electrode.

Further, a variety of signals and potentials are supplied to the signal line driver circuit 4003 which is formed separately, the scan line driver circuit 4004 or the pixel portion 4002 from an FPC 4018.

A connection terminal electrode 4015 is formed using the same conductive film as the pixel electrode 4030 included in the liquid crystal element 4013. A terminal electrode 4016 is formed using the same conductive film as a source electrode and a drain electrode of the thin film transistors 4010 and 4011.

The connection terminal electrode 4015 is electrically connected to a terminal included in the FPC 4018 through an anisotropic conductive film 4019.

Note that FIGS. 16A1, 16A2, and 16B illustrate an example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

For the liquid crystal display device in this embodiment, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optically compensated birefringence (OCB) mode, a ferroelectric liquid crystal (FLC) mode, an antiferroelectric liquid crystal (AFLC) mode, and the like can be used.

Through the above steps, a liquid crystal display device in which the frame is narrowed, the contrast is high, and the image quality is favorable can be manufactured.

Note that this embodiment can be applied to any of the other embodiments.

[Embodiment 7]

In this embodiment, an example of electronic paper will be described as a semiconductor device.

The semiconductor device can be used for electronic paper in which electronic ink is driven by an element electrically connected to a switching element. The electronic paper is also called an electrophoretic display device (electrophoretic display) and has advantages in that it has the same level of readability as regular paper, it has less power consumption than other display devices, and it can be set to have a thin and light form.

Electrophoretic displays can have various modes. Electrophoretic displays contain a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Note that the first particles and the second particles have different colors (which may be colorless).

Thus, an electrophoretic display is a display that utilizes a so-called dielectrophoretic effect by which a substance having a high dielectric constant moves to a high-electric field region. An electrophoretic display device does not need to use a polarizing plate which is required in a liquid crystal display device.

A solution in which the above microcapsules are dispersed in a solvent is referred to as electronic ink. This electronic ink can be printed on a surface of glass, plastic, cloth, paper, or the like. Furthermore, color display can be achieved with a color filter or particles including a pigment.

When a plurality of the above-described microcapsules are arranged as appropriate over an active matrix substrate so as to be sandwiched between two electrodes, an active matrix display device can be completed, and display can be performed by application of an electric field to the microcapsules. For example, the active matrix substrate obtained with the thin film transistors described in any of Embodiments 1 to 5 can be used.

Note that the first particles and the second particles in the microcapsules may be formed using one of a single material selected from a conductive material, an insulating material, a semiconductor material, a magnetic material, a liquid crystal material, a ferroelectric material, an electroluminescent material, an electrochromic material, and a magnetophoretic material, or formed using a composite material of any of these.

Figure 17:
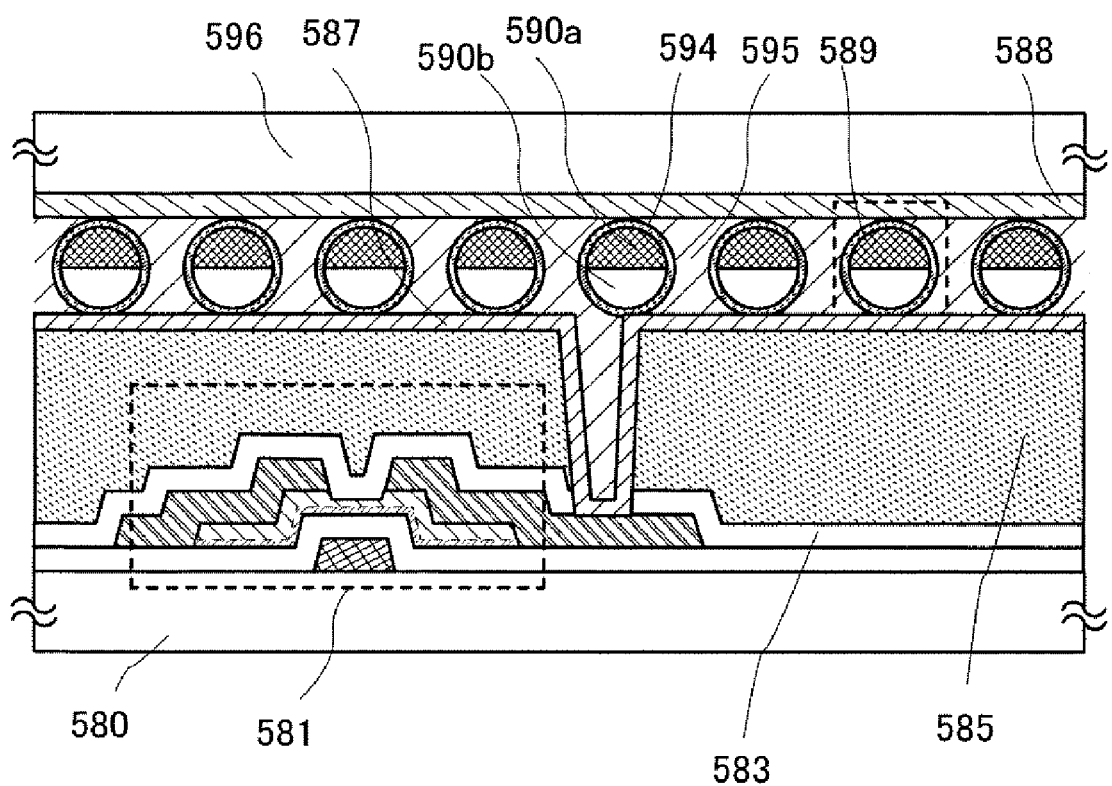
FIG. 17 is a cross-sectional view illustrating electronic paper.

FIG. 17 illustrates an active matrix electronic paper as an example of a semiconductor device. The thin film transistors described in any of Embodiments 1 to 5 can be used as a thin film transistor 581 which is used for the semiconductor device in this embodiment.

The electronic paper in FIG. 17 is an example of a display device using a twisting ball display system. In the twisting ball display method, spherical particles each colored in black and white are arranged between a first electrode and a second electrode for a display element, and a potential difference is generated between the first electrode and the second electrode to control orientation of the spherical particles, so that display is performed.

The thin film transistor 581 formed over a substrate 580 is a bottom-gate thin film transistor and covered with an insulating film 583. A source or drain electrode layer of the thin film transistor 581 is in contact with a first electrode 587 through an opening formed in the insulating film 583 and an insulating layer 585, whereby the thin film transistor 581 is electrically connected to the first electrode 587. Spherical particles 589 are provided between the first electrode 587 and a second electrode 588 formed on a second substrate 596. Each spherical particle 589 includes a black region 590*a* and a white region 590*b*, and a cavity 594 filled with liquid around the black region 590*a* and the white region 590*b*. The spherical particles 589 are surrounded by filler 595 such as a resin (see FIG. 17). In this embodiment, the first electrode 587 corresponds to a pixel electrode, and the second electrode 588 corresponds to a common electrode. The second electrode 588 is electrically connected to a common potential line provided over the substrate where the thin film transistor 581 is formed. With the use of a common connection portion, the second electrode 588 can be electrically connected to the common potential line through conductive particles provided between the pair of substrates.

Alternatively, it is possible to use an electrophoretic element instead of the twisting ball. A microcapsule having a diameter of approximately 10 μm. to 200 μm, in which transparent liquid, positively charged white microparticles, and negatively charged black microparticles are encapsulated, is used. In the microcapsule provided between the first electrode and the second electrode, when an electric field is applied by the first electrode and the second electrode, the white microparticles and the black microparticles move to opposite directions to each other, so that white or black can be displayed. A display element using this principle is an electrophoretic display element. The electrophoretic display element has higher reflectance than a liquid crystal display element, and thus, an auxiliary light is unnecessary, power consumption is low, and a display portion can be recognized in a dim place. Further, even when power is not supplied to the display portion, an image which has been displayed once can be maintained. Accordingly, a displayed image can be stored even when a semiconductor device having a display function (which may simply be referred to as a display device or a semiconductor device provided with a display device) is distanced from an electric wave source.

Through the above steps, a liquid crystal display device in which the frame is narrowed, the contrast is high, and the image quality is favorable can be manufactured.

Note that this embodiment can be applied to any of the other embodiments.

[Embodiment 8]

An example of a light-emitting display device will be described as a semiconductor device. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. Then, the carriers (electrons and holes) are recombined, and thus, the light-emitting organic compound is excited. Then, light emission is caused when the light-emitting organic compound returns to a ground state from the excited state. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that here, an organic EL element is described as a light-emitting element.

Figure 18A:
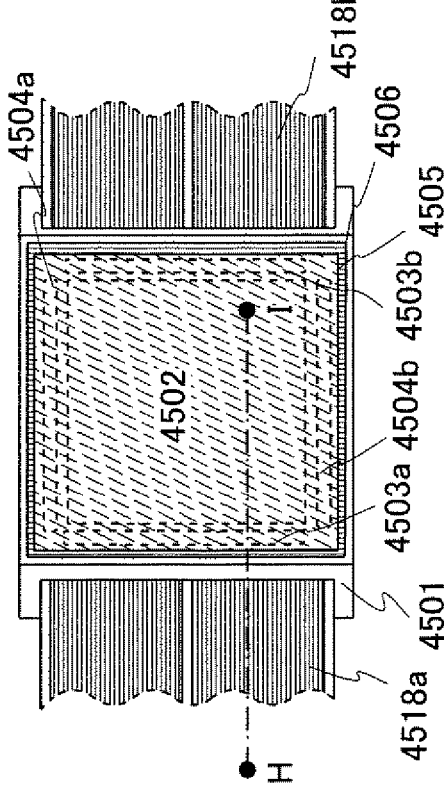
FIG. 18A is a top view and FIG. 18B is a cross-sectional view each illustrating a light-emitting display device.
Figure 18B:
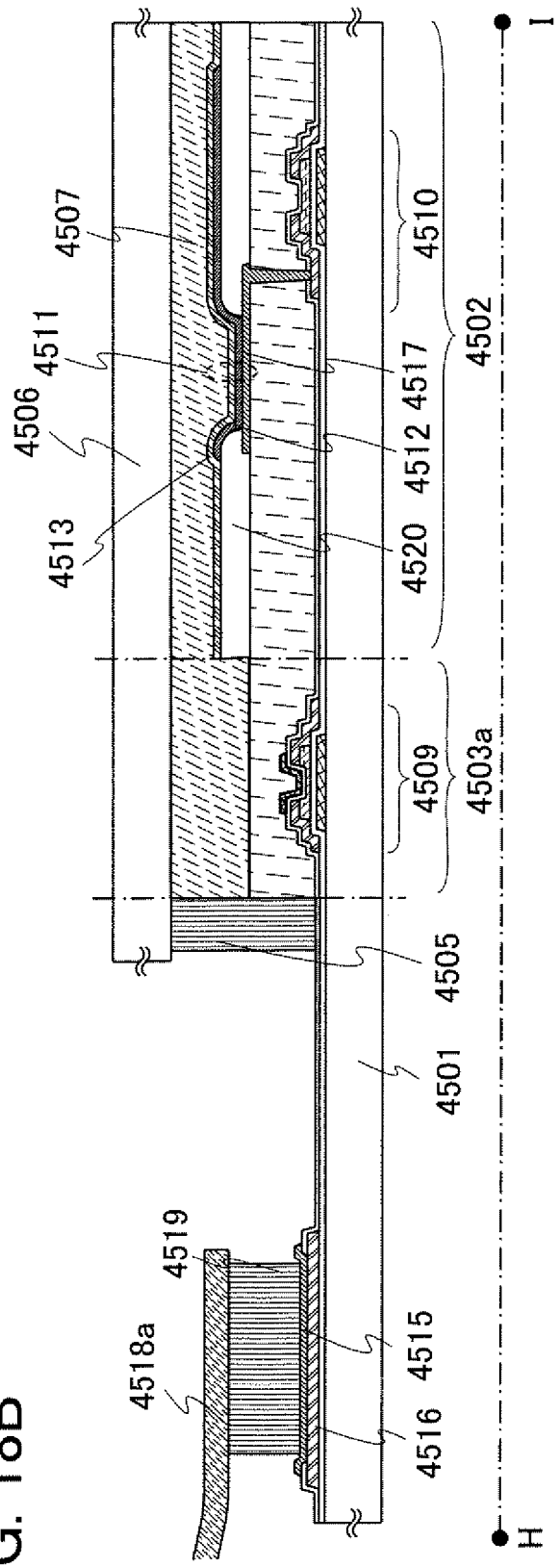

Next, the appearance and a cross section of a light-emitting display panel (also referred to as a light-emitting panel) which is an embodiment of a semiconductor device will be described with reference to FIGS. 18A and 18B. FIG. 18A is a plan view of a panel in which a thin film transistor and a light-emitting element that are formed over a first substrate are sealed between the first substrate and a second substrate with a sealant. FIG. 18B is a cross-sectional view taken along H-I in FIG. 18A.

A sealant 4505 is provided so as to surround a pixel portion 4502, signal line driver circuits 4503*a* and 4503*b*, and scan line driver circuits 4504*a* and 4504*b* which are provided over a first substrate 4501. In addition, a second substrate 4506 is provided over the pixel portion 4502, the signal line driver circuits 4503*a* and 4503*b*, and the scan line driver circuits 4504*a* and 4504*b*. Consequently, the pixel portion 4502, the signal line driver circuits 4503*a* and 4503*b*, and the scan line driver circuits 4504*a* and 4504*b* are sealed together with a filler 4507, by the first substrate 4501, the sealant 4505, and the second substrate 4506. In this manner, it is preferable that a panel be packaged (sealed) with a protective film (such as a laminate film or an ultraviolet curable resin film) or a cover material with high air-tightness and little degasification so that the panel is not exposed to the outside air.

The pixel portion 4502, the signal line driver circuits 4503*a* and 4503*b*, and the scanning line driver circuits 4504*a* and 4504*b*, which are formed over the first substrate 4501, each include a plurality of thin film transistors. A thin film transistor 4510 included in the pixel portion 4502 and a thin film transistor 4509 included in the signal line driver circuit 4503*a* are illustrated as an example in FIG. 18B.

The thin film transistors described in Embodiments 1 to 5 can be used as the thin film transistors 4509 and 4510.

Reference numeral 4511 denotes a light-emitting element, and a first electrode 4517 that is a pixel electrode included in the light-emitting element 4511 is electrically connected to the source electrode or the drain electrode of the thin film transistor 4510. Note that the light-emitting element 4511 has a stacked-layer structure of the first electrode 4517, an EL layer 4512, and a second electrode 4513, and there is no particular limitation on the structure. The structure of the light-emitting element 4511 can be changed as appropriate depending on the direction in which light is extracted from the light-emitting element 4511, or the like.

A partition 4520 is formed using an organic resin film, an inorganic insulating film, or organic polysiloxane. In particular, it is preferable that the partition 4520 be formed using a photosensitive material and an opening portion be formed over the first electrode 4517 so that a sidewall of the opening portion is formed as an inclined surface with a continuous curvature.

The EL layer 4512 may be formed as a single layer or a plurality of layers are stacked.

An oxide insulating film may be formed over the second electrode 4513 and the partition 4520 in order to prevent entry of oxygen, hydrogen, moisture, carbon dioxide, or the like into the light-emitting element 4511. The oxide insulating film is formed using an inorganic insulating film which blocks impurities such as moisture, hydrogen ions, and OH⁻.

In addition, a variety of signals and potentials are supplied to the signal line driver circuits 4503*a* and 4503*b*, the scan line driver circuits 4504*a* and 4504*b*, or the pixel portion 4502 from FPCs 4518*a* and 4518*b*.

A connection terminal electrode 4515 is formed using the same conductive film as the first electrode 4517 included in the light-emitting element 4511, and a terminal electrode 4516 is formed using the same conductive film as source electrodes and drain electrodes included in the thin film transistors 4509 and 4510.

The connection terminal electrode 4515 is electrically connected to a terminal included in the FPC 4518*a* through an anisotropic conductive film 4519.

The second substrate located in the direction in which light is extracted from the light-emitting element 4511 needs to have a light-transmitting property. In that case, a light-transmitting material such as a glass plate, a plastic plate, a polyester film, or an acrylic film is used for the second substrate.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. For example, nitrogen is used for the filler.

If necessary, an optical film such as a polarizing plate, a circularly polarizing plate (including an elliptically polarizing plate), a retardation plate (a quarter-wave plate or a half-wave plate), or a color filter may be provided as appropriate for a light-emitting surface of the light-emitting element. Further, a polarizing plate or a circularly polarizing plate may be provided with an anti-reflection layer. For example, anti-glare treatment by which reflected light can be diffused by projections and depressions on the surface so as to reduce the glare can be performed.

As the signal line driver circuits 4503*a* and 4503*b* and the scan line driver circuits 4504*a* and 4504*b*, a driver circuit formed using a single crystal semiconductor layer or a polycrystalline semiconductor layer may be mounted on a substrate separately prepared. Alternatively, only the signal line driver circuits or a part thereof, or only the scan line driver circuits or a part thereof may be separately formed and mounted. This embodiment is not limited to the structure illustrated in FIGS. 18A and 18B.

Through the above steps, a liquid crystal display device in which the frame is narrowed, the contrast is high, and the image quality is favorable can be manufactured.

Note that this embodiment can be applied to any of the other embodiments.

[Embodiment 9]

A semiconductor device disclosed in this specification can be applied to electronic paper. An electronic paper can be used for electronic appliances of a variety of fields as long as they can display data. For example, electronic paper can be applied to an electronic book reader (e-book), a poster, a digital signage, a public information display (PID), an advertisement in a vehicle such as a train, displays of various cards such as a credit card, and the like. An example of the electronic appliance is illustrated in FIG. 19.

Figure 19:
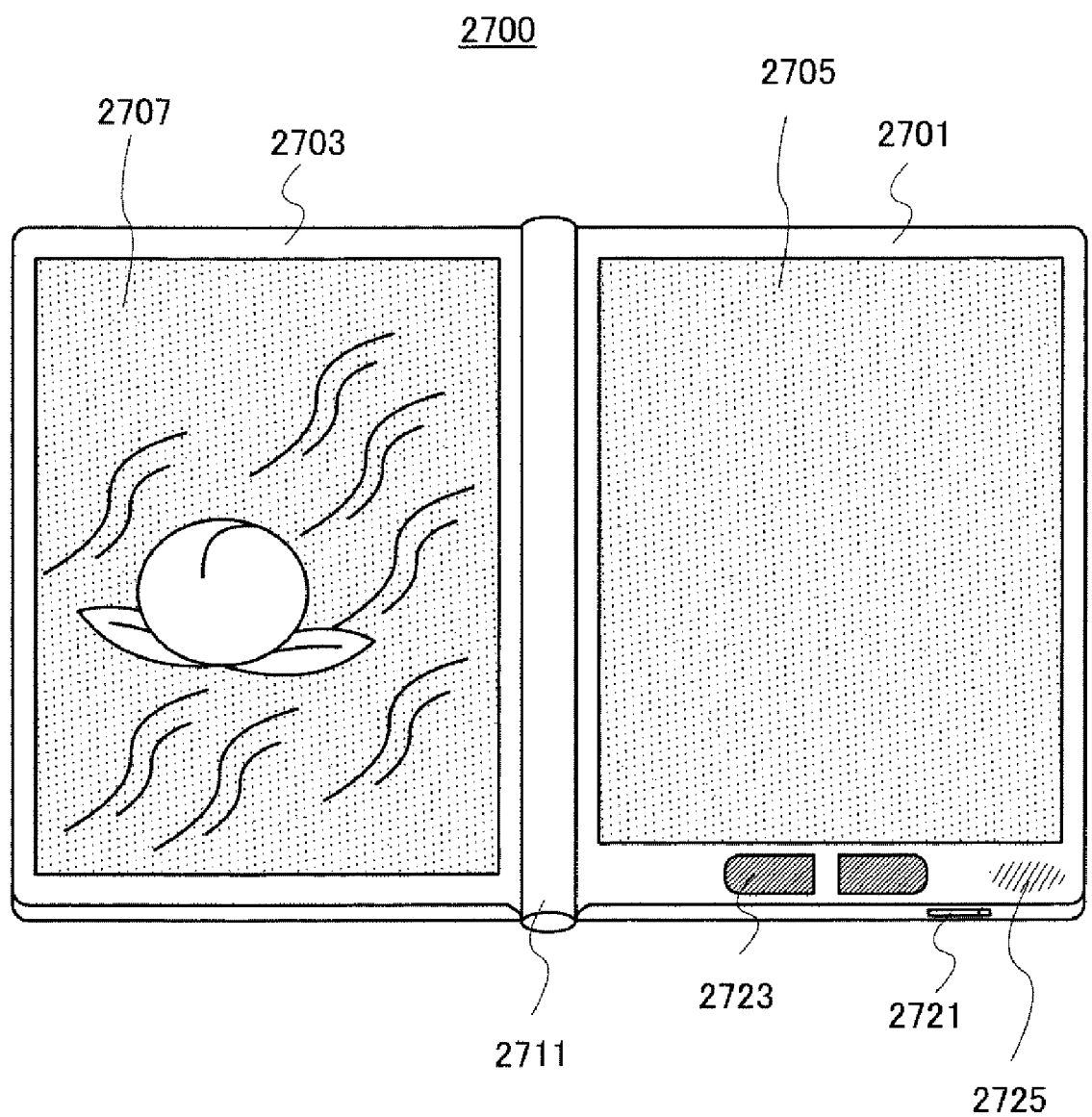
FIG. 19 is an external view of an example of an electronic book reader.

FIG. 19 illustrates an example of an electronic book reader. For example, the electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can be operated like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 19) and graphics can be displayed on a display portion on the left side (the display portion 2707 in FIG. 19).

FIG. 19 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may also be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the electronic book reader 2700 may have a function of an electronic dictionary.

The electronic book reader 2700 may have a configuration capable of wirelessly transmitting and receiving data. Through wireless communication, desired book data or the like can be purchased and downloaded from an electronic book server.

[Embodiment 10]

The semiconductor device disclosed in this specification can be applied to a variety of electronic appliances (including game machines). Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 20A:
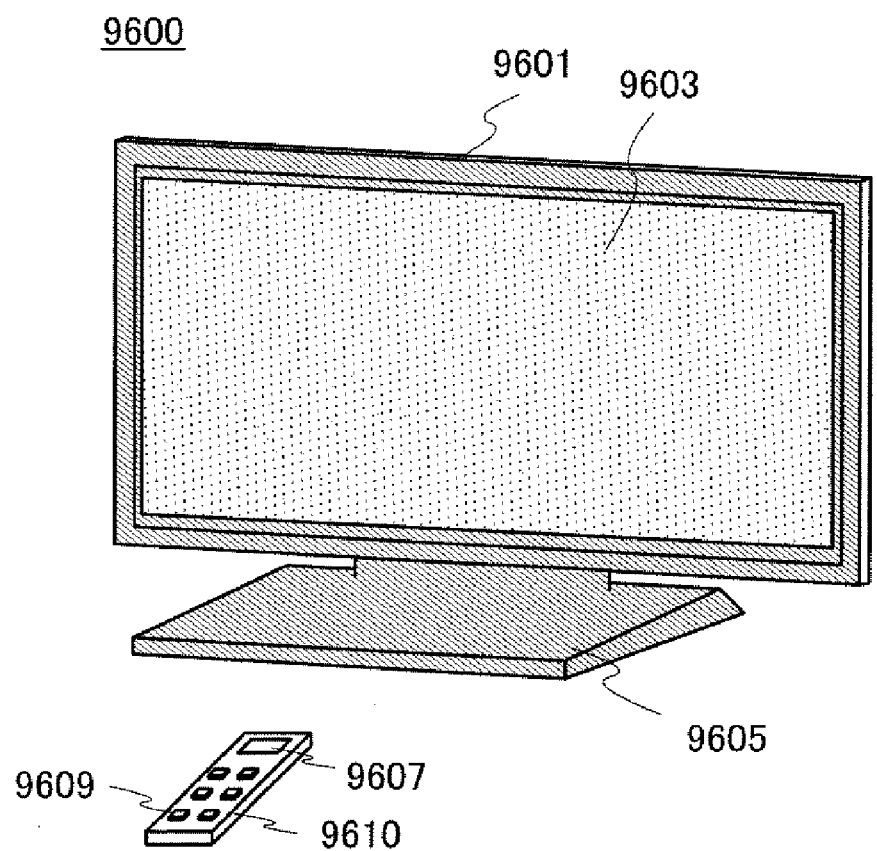
FIG. 20A is an external view of an example of a television set and FIG. 20B is an external view of an example of a digital photo frame.

FIG. 20A illustrates an example of a television set. In the television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the receiver, general television broadcasts can be received. Moreover, when the display device is connected to a communication network with or without wires via the modem, one-way (from a sender to a receiver) or two-way (e.g., between a sender and a receiver or between receivers) information communication can be performed.

Figure 20B:
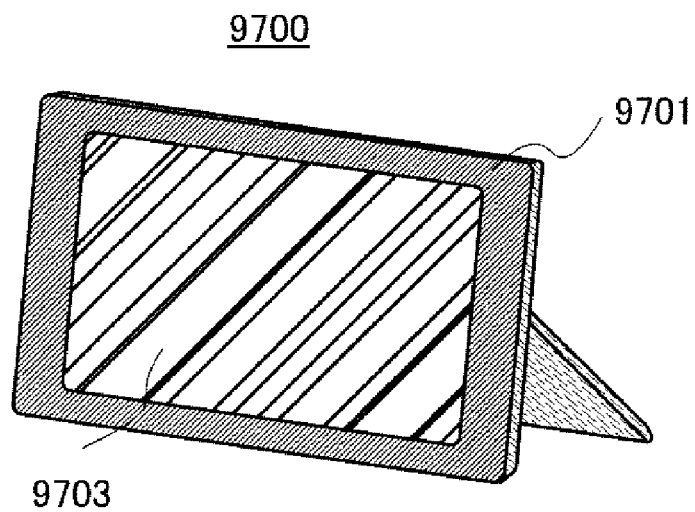

FIG. 20B illustrates an example of a digital photo frame. For example, in the digital photo frame 9700, a display portion 9703 is incorporated in a housing 9701. The display portion 9703 can display a variety of images. For example, the display portion 9703 can display data taken with a digital camera or the like and function as a normal photo frame Note that the digital photo frame 9700 is provided with an operation portion, an external connection portion (a USB terminal, a terminal that can be connected to various cables such as a USB cable, or the like), a recording medium insertion portion, and the like. Although these components may be provided on the same surface as the display portion, it is preferable to provide them on the side surface or the back surface for the design aesthetics. For example, a memory that stores image data taken with a digital camera is inserted in the recording medium insertion portion of the digital photo frame 9700 and the data is loaded, whereby the image data can be displayed on the display portion 9703.

The digital photo frame 9700 may be configured to transmit and receive data wirelessly. Through wireless communication, desired image data can be loaded to be displayed.

Figure 21:
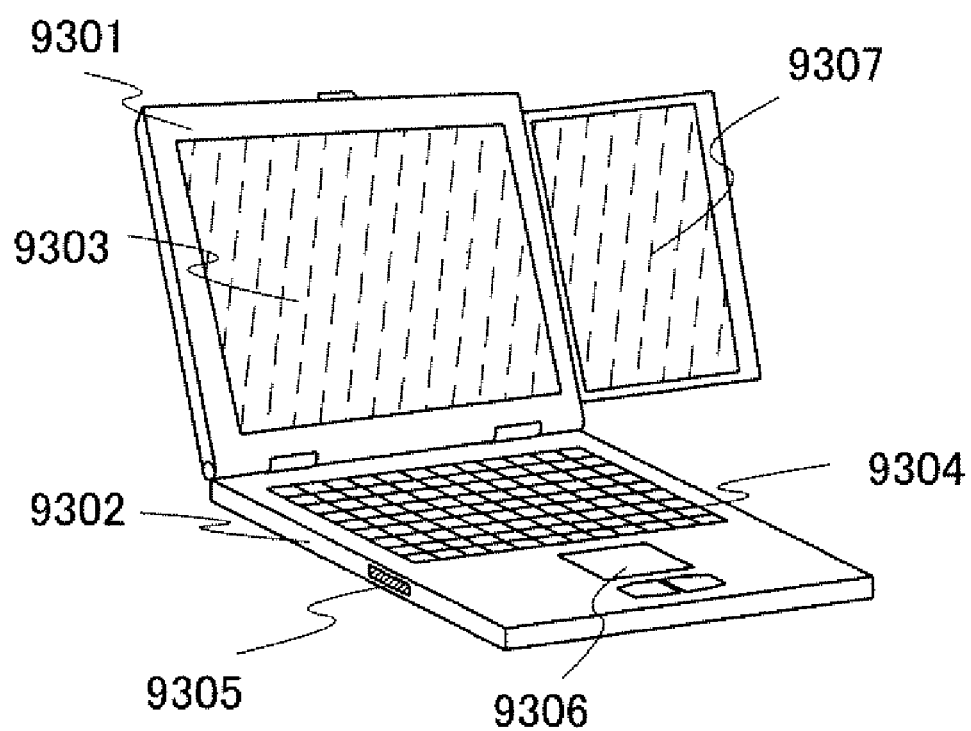
FIG. 21 is a perspective view illustrating an example of a portable computer.

FIG. 21 is a perspective view illustrating an example of a portable computer.

In the portable computer in FIG. 21, a top housing 9301 having a display portion 9303 and a bottom housing 9302 having a keyboard 9304 can overlap with each other by closing a hinge unit which connects the top housing 9301 and the bottom housing 9302. The portable computer in FIG. 21 can be convenient for carrying, and in the case of using the keyboard for input, the hinge unit is opened so that the user can input looking at the display portion 9303.

The bottom housing 9302 includes a pointing device 9306 with which input can be performed, in addition to the keyboard 9304. Further, when the display portion 9303 is a touch input panel, input can be performed by touching part of the display portion. The bottom housing 9302 includes an arithmetic function portion such as a CPU or hard disk. In addition, the bottom housing 9302 includes another device, for example, an external connection port 9305 into which a communication cable conformable to communication standards of a USB is inserted.

The top housing 9301 includes a display portion 9307 and can keep the display portion 9307 therein by sliding it toward the inside of the top housing 9301; thus, the top housing 9301 can have a large display screen. In addition, the user can adjust the orientation of a screen of the display portion 9307 which can be kept in the top housing 9301. When the display portion 9307 which can be kept in the top housing 9301 is a touch input panel, input can be performed by touching part of the display portion.

The display portion 9303 or the display portion 9307 which can be kept in the top housing 9301 are formed with an image display device of a liquid crystal display panel, a light-emitting display panel such as an organic light-emitting element or an inorganic light-emitting element, or the like.

In addition, the portable computer in FIG. 21, which can be provided with a receiver and the like, can receive a television broadcast to display an image on the display portion 9303 or the display portion 9307. The user can watch a television broadcast with the whole screen of the display portion 9307 by sliding and exposing the display portion 9307 and adjusting the angle thereof, with the hinge unit which connects the top housing 9301 and the bottom housing 9302 closed. In this case, the hinge unit is not opened and display is not performed on the display portion 9303. In addition, start up of only a circuit for displaying television broadcast is performed. Therefore, power can be consumed to the minimum, which is useful for the portable computer whose battery capacity is limited.

Note that this embodiment can be applied to any of the other embodiments.

EXAMPLE 1

In this example, change of the electric characteristics of a dual-gate thin film transistor and a single-gate thin film transistor in the thin film transistor illustrated in FIGS. 3A to 3C will be described.

First, a manufacturing process of the thin film transistor is described with reference to FIGS. 12A to 12D.

An insulating layer 303 was formed over a substrate 301 and a gate electrode 305 was formed over the insulating layer 303.

Here, as the substrate 301, a glass substrate (EAGLE2000 manufactured by Corning Incorporated) was used.

After a 50-nm-thick titanium layer was formed over the insulating layer 303 by a sputtering of a titanium target with the use of argon ions with a flow rate of 20 sccm, a 380-nm-thick aluminum layer was formed over the titanium layer by a sputtering of an aluminum target with the use of argon ions with a flow rate of 50 sccm. Then, a 120-nm-thick titanium layer was formed over the aluminum layer by a sputtering of a titanium target with the use of argon ions with a flow rate of 20 sccm. Next, after the titanium layer was coated with a resist, the resist was exposed to light with the use of a first photomask. After that, development was performed, so that a resist mask was formed.

Next, the gate electrode 305 was formed by etching treatment was performed with the use of the resist mask. In this example, an inductively coupled plasma (ICP) etching apparatus was used. First etching was performed in conditions in which the ICP power was 600 W, the bias power was 250 W, the pressure was 1.2 Pa, and as for the etching gases, the flow rate of boron trichloride was 60 sccm and the flow rate of chlorine was 20 sccm. After that, second etching was performed in conditions in which the ICP power was 500 W, the bias power was 50 W, the pressure was 2.0 Pa, and as for the etching gas, the flow rate of carbon fluoride was 80 sccm.

After that, the resist mask was removed.

Figure 12A:
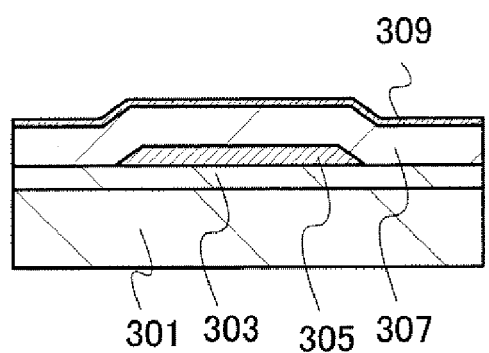
FIGS. 12A to 12D are cross-sectional views illustrating methods for manufacturing a thin film transistor according to an example of the present invention.

Next, a gate insulating layer 307 and a microcrystalline semiconductor layer 309 was formed over the gate electrode 305 and the insulating layer 303. The steps up to this point are illustrated in FIG. 12A.

Here, as the gate insulating layer 307, a 110-nm-thick silicon nitride layer and a 110-nm-thick silicon oxynitride layer were formed.

The deposition conditions of the silicon nitride layer were as follows: $SiH_4$, $H_2$, $N_2$, and $NH_3$ were introduced as source gases at the flow rates of 40 sccm, 500 sccm, 550 sccm, and 140 sccm, respectively, and were stabilized, the pressure of a treatment chamber was 100 Pa, the substrate temperature was 280° C., and a plasma CVD method was conducted in which plasma discharge was performed using an RF power frequency of 13.56 MHz and a power of an RF power source of 370 W.

The deposition conditions of the silicon oxynitride layer were as follows: $SiH_4$ and $N_2O$ are introduced as source gases at flow rates of 50 sccm and 600 sccm, respectively, and are stabilized; the pressure in the treatment chamber is 25 Pa; the temperature is 280° C.; and plasma discharge of 30 W was performed.

Then, the substrate was carried out of the treatment chamber, the inside of the treatment chamber was cleaned, an amorphous silicon layer was deposited as a protective layer inside of the treatment chamber, the substrate was carried into the treatment chamber, and then the microcrystalline semiconductor layer 309 was formed.

The deposition conditions of the microcrystalline semiconductor layer 309 were as follows: $SiH_4$, $H_2$, and argon were introduced as source gases at flow rates of 10 sccm, 1500 sccm, and 1500 sccm, respectively, and were stabilized, the pressure in the treatment chamber was set to 280 Pa, the substrate temperature was 280° C., and a plasma CVD method was conducted in which plasma discharge was performed using an RF power source frequency of 1156 MHz and a power of an RF power source of 50 W.

In Samples 1 and 3, a 70-nm-thick microcrystalline silicon layer was formed as the microcrystalline semiconductor layer 309. In Samples 2 and 4, a 30-nm-thick microcrystalline silicon layer was formed as the microcrystalline semiconductor layer 309.

Figure 12B:
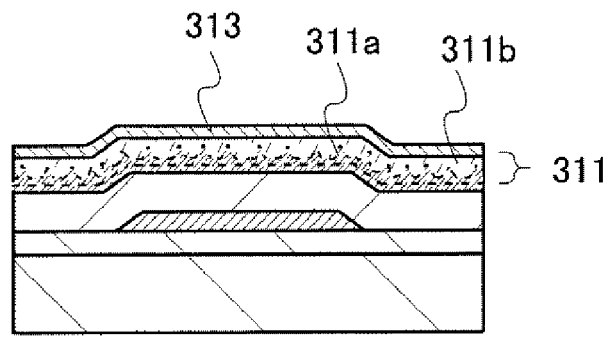
Figure 12C:
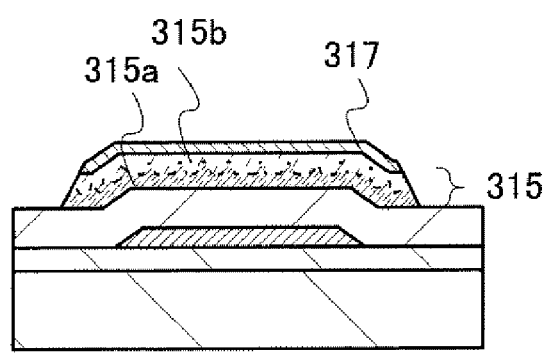

Next, as illustrated in FIG. 12B, a semiconductor layer 311 was formed and an impurity semiconductor layer 313 was formed over the semiconductor layer 311.

The deposition conditions of the semiconductor layer 311 were as follows: $SiH_4$, 1000 ppm $NH_3$ (diluted with hydrogen), $H_2$. and Ar were introduced as source gases at flow rates of 40 sccm, 125 sccm, 1375 sccm, and 2000 sccm, respectively, and were stabilized, the pressure in the treatment chamber was 280 Pa, the substrate temperature was 280° C., and plasma discharge was performed using a power of an RF power source of 100 W.

In Samples 1 and 3, an 80-nm-thick silicon layer was formed as the semiconductor layer 311. In Samples 2 and 4, a 175-nm-thick silicon layer was formed as the semiconductor layer 311.

As the impurity semiconductor layer 313, an amorphous silicon layer to which phosphorus was added was formed to a thickness of 50 nm. As the deposition conditions at this time, flow rates of silane and 0.5% phosphine (diluted with hydrogen) were 100 sccm and 170 sccm, respectively, the deposition temperature was 280° C., the pressure was 170 Pa, and a plasma CVD method was conducted in which plasma discharge was performed using an RF power source frequency of 13.56 MHz and a power of an RF power source of 60 W.

Next, a resist was applied to the impurity semiconductor layer 313, and then exposed to light using a second photomask and developed, so that a resist mask was formed. Next, the microcrystalline semiconductor layer 309, the semiconductor layer 311, and the impurity semiconductor layer 313 were etched with use of the resist mask, so that a semiconductor layer 315 including a microcrystalline semiconductor region 315a and an amorphous semiconductor region 315b and an impurity semiconductor layer 317 were formed (see FIG. 12C). Here, an ICP etching apparatus was used, and the etching conditions were as follows: the source power was 1000 W, the bias power was 80 W, the pressure was 1.51 Pa, and chlorine was used as an etching gas at a flow rate of 100 sccm. After that, the resist mask was removed.

Figure 12D:
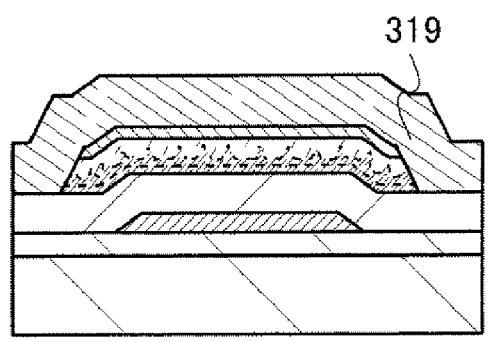

Next, as illustrated in FIG. 12D, a conductive layer 319 was formed so as to cover the gate insulating layer 307, the semiconductor layer 315, and the impurity semiconductor layer 317. Here, after a 50-nm-thick titanium layer was formed by a sputtering of a titanium target with use of argon ions with a flow rate of 20 sccm, an aluminum layer with a thickness of 200 nm was formed over the titanium layer by a sputtering of an aluminum target with use of argon ions with a flow rate of 50 sccm. Then, a 50-nm-thick titanium layer was formed over the aluminum layer by a sputtering of a titanium target with use of argon ions with a flow rate of 20 sccm.

Next, a resist was applied to the conductive layer 319, and then exposed to light using a third photomask and developed, so that a resist mask is formed. Next, the conductive layer 319 was subjected to dry etching with use of the resist mask, so that a wiring 321 was formed. The impurity semiconductor layer 317 was subjected to dry etching, so that a source/drain region 323 was formed, and further the semiconductor layer 315 was etched.

Here, the etching conditions were as follows: the ICP power was 450 W, the bias power was 100 W, the pressure was 1.9 Pa, and the etching gas included boron chloride with a flow rate of 60 sccm and chlorine with a flow rate of 20 sccm. In Samples 1 and 3, the semiconductor layer 325 was etched so that the depth of the recessed portion of the semiconductor layer 325 was greater than or equal to 100 nm and less than or equal to 120 nm, and the thickness of a region that is not covered with the wiring 321 of the semiconductor layer 325 is greater than or equal to 30 nm and less than or equal to 50 nm. In Samples 2 and 4, the semiconductor layer 329 was etched so that the depth of the recessed portion of the semiconductor layer 329 was greater than or equal to 20 nm and less than or equal to 40 nm, and the thickness of a region that is not covered with the wiring 321 of the semiconductor layer 329 is greater than or equal to 165 nm and less than or equal to 185 nm. Note that in this example, the wirings 321 serving as the source and drain electrodes are linear in a plan view.

Next, the surfaces of the semiconductor layers 325 and 329 were irradiated with carbon fluoride plasma so that an impurity remaining on the surfaces of the semiconductor layers 325 and 329 was removed. Here, the etching conditions were as follows: the source power was 1000 W, the bias power was 0 W, the pressure was 0.67 Pa, and the etching gas was carbon fluoride with a flow rate of 100 sccm.

Next, the surfaces of the semiconductor layers 325 and 328 were irradiated with water plasma, so that surface defects of the semiconductor layers 325 and 329 were reduced and the insulation properties of the source and drain region were improved. Here, the semiconductor layers 325 and 329 was irradiated with plasma which was generated by introducing water vapor with a flow rate of 300 sccm, the source power of 1800 W, and the pressure of 66.5 Pa. After that, the resist mask was removed.

Next, a silicon nitride layer was formed as an insulating layer 327. As the deposition conditions at this time, $SiH_4$, $NH_3$, nitrogen, and hydrogen were introduced as source gases at flow rates of 20 sccm, 220 sccm, 450 sccm, and 450 sccm, respectively, the pressure in the treatment chamber was 160 Pa, the substrate temperature was 250° C., and plasma discharge was performed at an output of 200 W, whereby the silicon nitride layer with a thickness of 300 nm was formed.

Figure 13A:
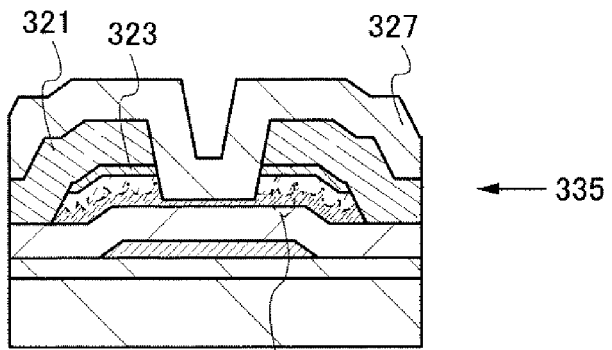
FIGS. 13A to 13D are cross-sectional views each illustrating a thin film transistor according to an example of the present invention.
Figure 13B:
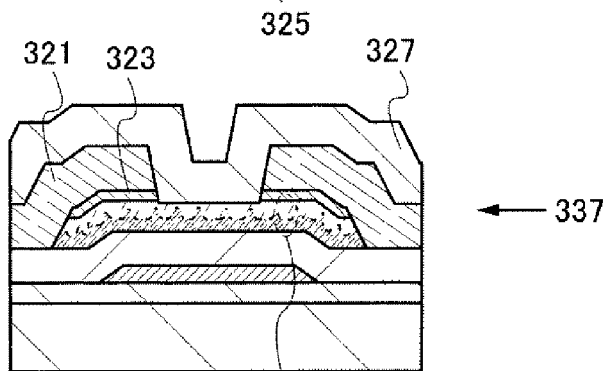

Although not shown in FIGS. 13A and 13B, the resist was applied to the insulating layer 327, and then exposed to light using a fourth photomask and developed, so that a resist mask was formed. With use of the resist mask, the insulating layer 327 were partly subjected to dry etching so that the wiring 321 serving as the source and drain electrodes were exposed. The insulating layer 327 and the gate insulating layer 307 were partly subjected to dry etching, so that the gate electrode 305 was exposed. After that, the resist mask was removed.

Through the above steps, thin film transistors 335 and 337 were manufactured (see FIGS. 13A and 13B).

Next, after a conductive layer was formed over the insulating layer 327, a resist was applied to the conductive layer, and then exposed to light using a fifth photomask and developed, so that a resist mask was formed. The conductive layer is partly dry-etched with use of the resist mask, so that a back-gate electrode 331 was formed.

Here, a 50-nm-thick indium tin oxide layer containing silicon oxide was formed by a sputtering method, and then the back-gate electrode 331 was formed by wet etching treatment. Although not illustrated, the back-gate electrode 331 is connected to the gate electrode 305.

Figure 13C:
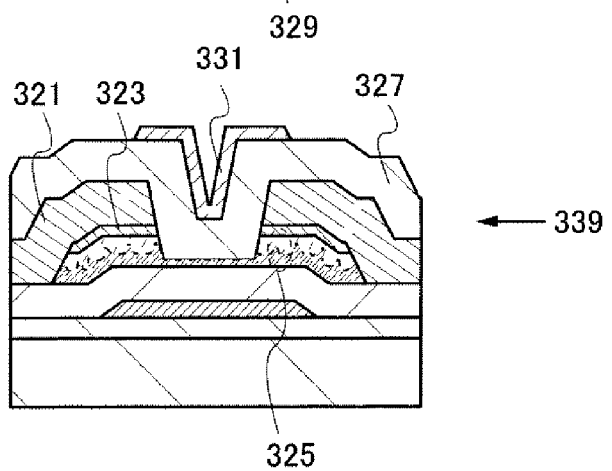
Figure 13D:
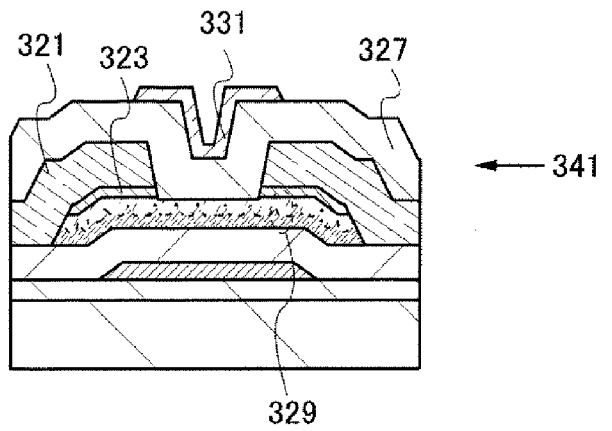

Through the above steps, thin film transistors 339 and 341 were manufactured (see FIGS. 13C and 13D).

Next, FIGS. 14A and 14B and FIGS. 15A and 15B show the results of measuring electric characteristics of the thin film transistor. In FIGS. 14A and 14B and FIGS. 15A and 15B, the horizontal axis indicates a gate voltage, the left vertical axis indicates a drain current, and the right vertical axis indicates the field-effect mobility. The current-voltage characteristics at drain voltages of 1 V and 10 V are shown using solid lines and the field-effect mobility at a drain voltage of 10 V is shown using dashed lines. Note that the field-effect mobility of the thin film transistor in this example was calculated under the conditions that the channel length was 3.6 μm, the channel width was 20 μm, the thickness of the gate insulating layer was 220 nm, and the average permittivity was 5.17.

Figure 14A:
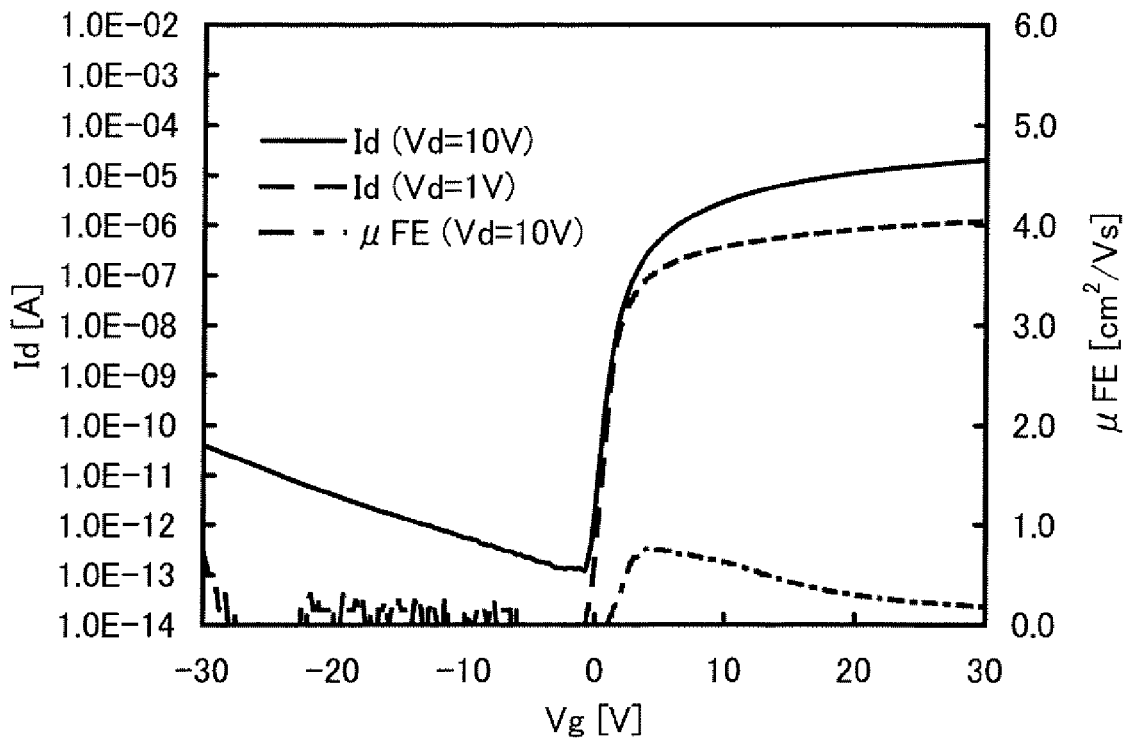
FIGS. 14A and 14B each show electric characteristics of a thin film transistor according to an example of the present invention.
Figure 14B:
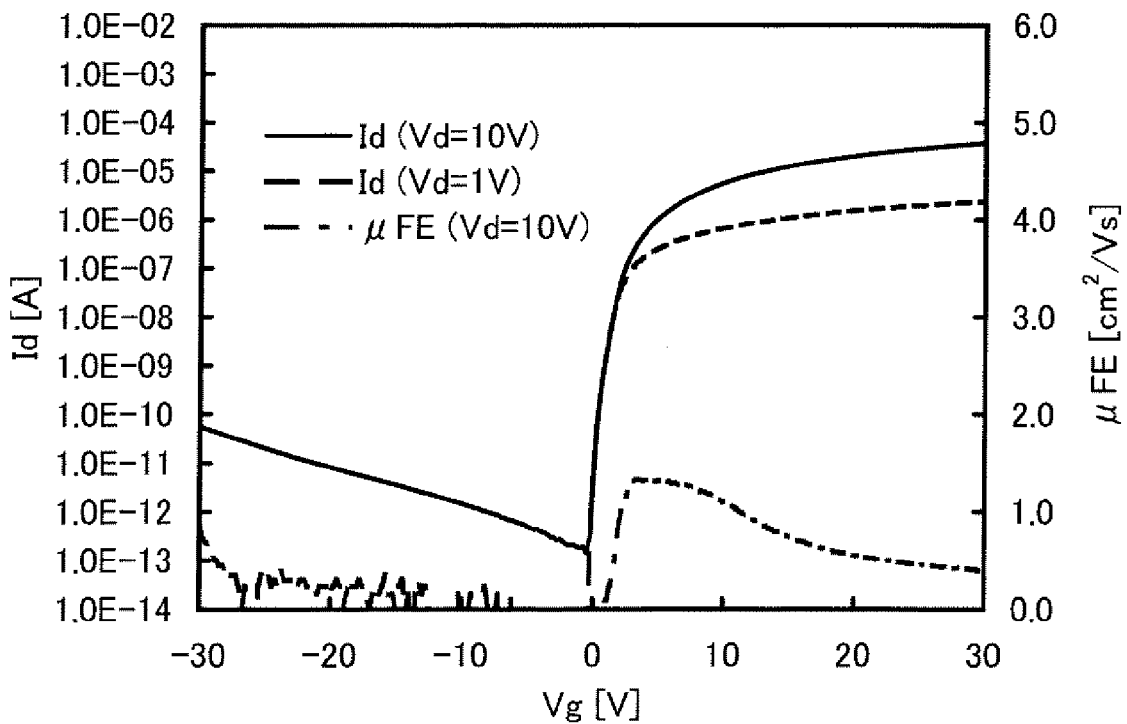

FIG. 14A shows electrical characteristics of the thin film transistor 335 of Sample 1 and FIG. 14B shows electrical characteristics of the thin film transistor 339 of Sample 3.

Figure 15A:
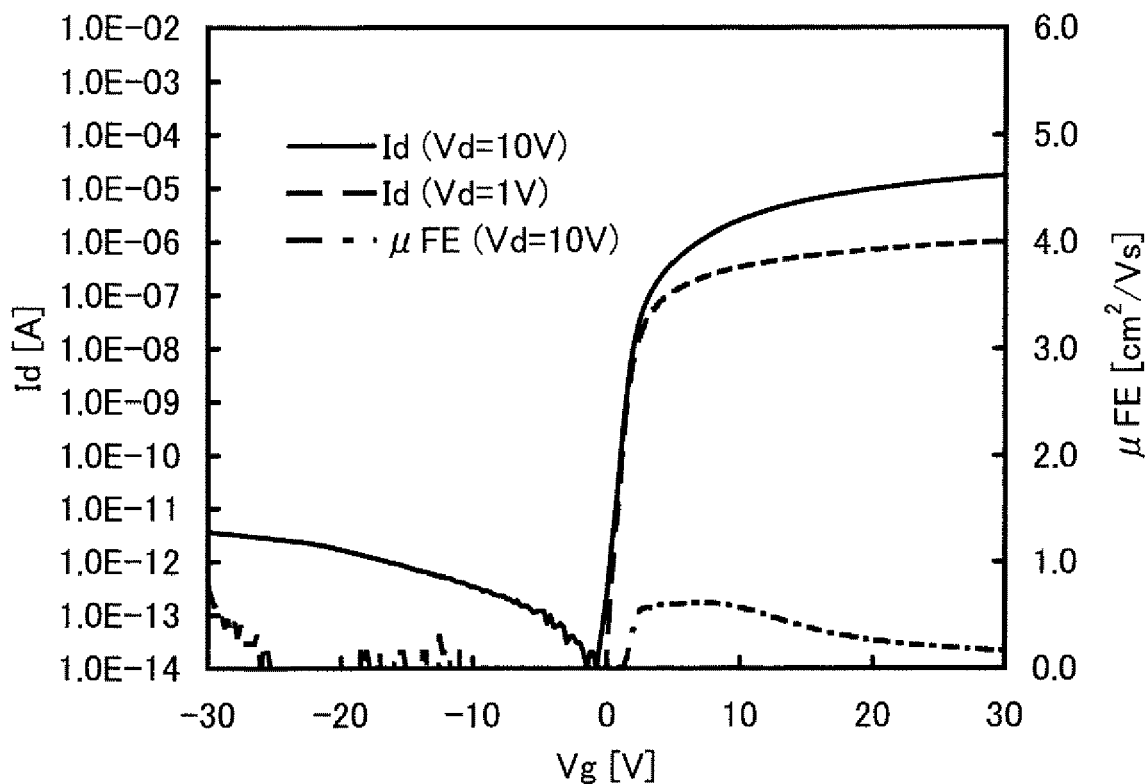
FIGS. 15A and 15B each show electric characteristics of a thin film transistor according to an example of the present invention.
Figure 15B:
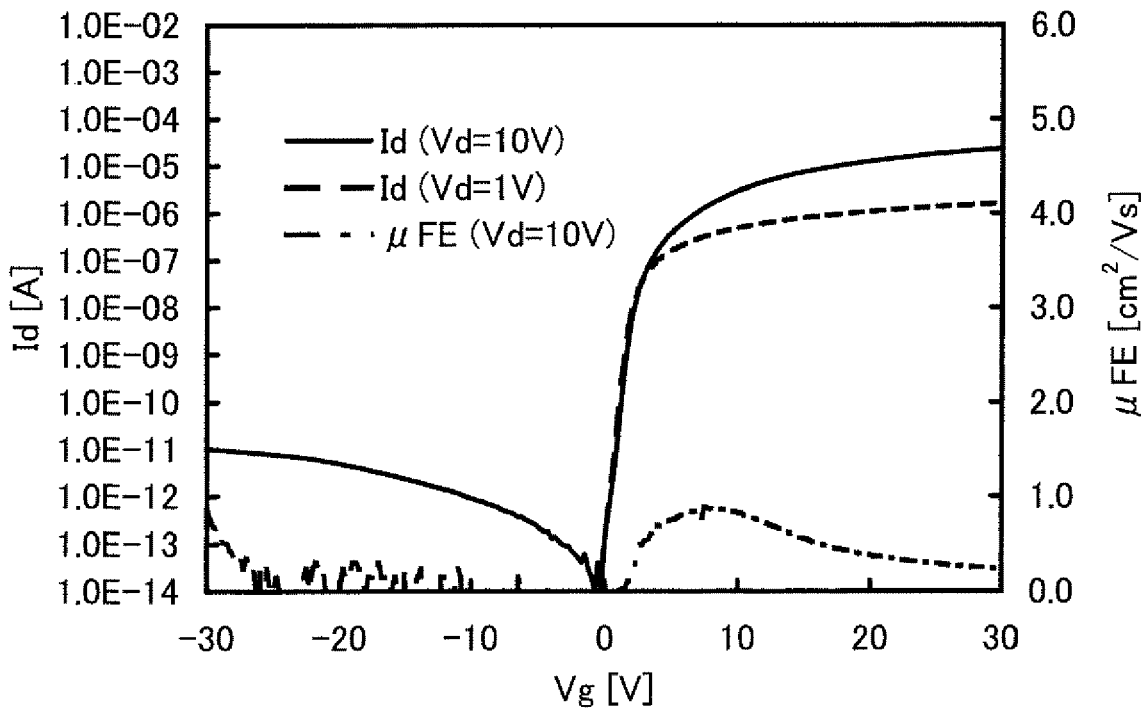

FIG. 15A shows electrical characteristics of the thin film transistor 337 of Sample 2 and FIG. 15B shows electrical characteristics of the thin film transistor 341 of Sample 4.

Table 1 shows on-state current when the drain voltage was 10 V and the gate voltage was 15 V (shown as Ion (Vg=15V)), minimum off-state current (shown as Ioff (min)), the off-state current when the gate voltage of the minimum off state current was −10 V (shown as Ioff (min. −10 V), threshold voltage (shown as Vth), S value (shown as S-value), and the field-effect mobility when the drain voltage was 10 V (shown as μFE (Vd=10 V), in the thin film transistors 335, 337, 339, and 341.

TABLE 1

|  | Sample 1 | Sample 3 | Sample 2 | Sample 4 |
| --- | --- | --- | --- | --- |
| Ion (Vg = 15 V) [μA] | 6.75 | 12.31 | 5.86 | 7.35 |
| Ioff (min.) [pA] | 0.12 | 0.14 | 0.01 | lower limt of measurement (<0.01) |
| Ioff (min. − 10 V) [pA] | 0.65 | 1.58 | 0.41 | 0.68 |
| Ion (Vg = 15 V)/Ioff (min.) [digit] | 7.75 | 7.94 | 8.77 | 10.87 |
| Vth [V] | 1.52 | 1.25 | 1.56 | 2.29 |
| S-value [V/dec.] | 0.36 | 0.21 | 0.37 | 0.32 |
| μFE (Vd = 10 V) [cm²/Vs] | 0.77 | 1.33 | 0.62 | 0.88 |

According to Table 1, the thin film transistor 335 of Sample 1 has higher field-effect mobility than the thin film transistor 337 of Sample 2. When the single-gate thin film transistor 337 of Sample 2 is compared to the dual-gate thin film transistor 341 of Sample 4, the field-effect mobility of the dual-gate thin film transistor 341 increases only 1.4 times than that of the single-gate thin film transistor 337. On the other hand, when the single-gate thin film transistor 335 of Sample 1 is compared to the dual-gate thin film transistor 339 of Sample 3, the field-effect mobility of the dual-gate thin film transistor 339 of Sample 3 increases approximately 1.7 times than that of the single-gate thin film transistor 335 of Sample 1. Further, the on-state current of the dual-gate thin film transistor 339 of Sample 3 increases approximately 2 times than that of the single-gate thin film transistor 335 of Sample 1.

From the above description, the thin film transistor 339 of Sample 3 is a dual-gate thin film transistor in which in a region overlapping with the gate electrode 305, the microcrystalline semiconductor region is provided between the gate insulating layer 307 and the insulating layer 327. Therefore, the on-state current can be increased and the area occupied by the thin film transistor can be reduced. Therefore, when the thin film transistor 339 of Sample 3 is used in a driver circuit, the frame of a display device can be narrowed.

This application is based on Japanese Patent Application serial No. 2009-266051 filed with Japan Patent Office on Nov. 24, 2009, the entire contents of which are hereby incorporated by reference.

What is claimed is:
1. A display device comprising:
a substrate;
a pixel portion including a single-gate transistor, the single-gate transistor comprising:
    a first gate electrode over the substrate;
    a gate insulating layer over the first gate electrode;
    a first semiconductor layer over the gate insulating layer, the first semiconductor layer comprising:
        a first microcrystalline semiconductor region over the gate insulating layer; and
        a first amorphous semiconductor region over the first microcrystalline semiconductor region,
    a pair of first wirings over the first amorphous semiconductor region; and
    an insulating layer over the pair of first wirings and the first amorphous semiconductor region,
a driver circuit including a dual-gate transistor, the dual-gate transistor comprising:
    a second gate electrode over the substrate;
    the gate insulating layer over the second gate electrode;
    a second semiconductor layer over the gate insulating layer, the second semiconductor layer comprising:
        a second microcrystalline semiconductor region over the gate insulating layer; and
        a pair of second amorphous semiconductor regions over the second microcrystalline semiconductor region,
    a pair of second wirings over the pair of second amorphous semiconductor regions;
    the insulating layer over the pair of second wirings and the second microcrystalline semiconductor region; and
    a back gate electrode over the insulating layer,
wherein the insulating layer in the pixel portion is over and in contact with the first amorphous semiconductor region in a first region that overlaps with a region between the pair of the first wirings,
wherein the insulating layer in the pixel portion is not in contact with the first microcrystalline semiconductor region in the first region, and
wherein the insulating layer in the driver circuit is over and in contact with the first amorphous semiconductor region and the second microcrystalline semiconductor region in a second region that overlaps with a region between the pair of the second wirings.
2. The display device according to claim 1,
wherein the first microcrystalline semiconductor region has a first projected portion whose tip is narrowed from the gate insulating layer toward the first amorphous semiconductor region, and wherein the second microcrystalline semiconductor region has a second projected portion whose tip is narrowed from the gate insulating layer toward the pair of second amorphous semiconductor regions.

3. The display device according to claim 2, wherein the each tip of the first projected portion and the second projected portion has an obtuse angle.

4. The display device according to claim 1, wherein semiconductor crystal grains are included in the first amorphous semiconductor region and the pair of second amorphous semiconductor regions.

5. The display device according to claim 1,
wherein the single-gate transistor further comprises a pair of first impurity regions provided between the first amorphous semiconductor region and the pair of first wirings, and
wherein the dual-gate transistor further comprises a pair of second impurity regions provided between the pair of second amorphous semiconductor regions and the pair of second wirings.

6. The display device according to claim 1,
wherein the pair of first wirings are in contact with a side surface of the first microcrystalline semiconductor region and a side surface of the first amorphous semiconductor region, and
wherein the pair of second wirings are in contact with a side surface of the second microcrystalline semiconductor region and a side surface of the pair of second amorphous semiconductor regions.

7. A display device comprising:
a substrate;
a pixel portion including a single-gate transistor, the single-gate transistor comprising:
a first gate electrode over the substrate;
a gate insulating layer over the first gate electrode;
a first semiconductor layer over the gate insulating layer, the first semiconductor layer comprising:
a first microcrystalline semiconductor region over the gate insulating layer; and
a first amorphous semiconductor region over the first microcrystalline semiconductor region,
a pair of first wirings over the first amorphous semiconductor region; and
an insulating layer over the pair of first wirings and the first amorphous semiconductor region,
a driver circuit including a dual-gate transistor, the dual-gate transistor comprising:
a second gate electrode over the substrate;
the gate insulating layer over the second gate electrode;
a second semiconductor layer over the gate insulating layer, the second semiconductor layer comprising:
a second microcrystalline semiconductor region over the gate insulating layer; and
a pair of second amorphous semiconductor regions over the second microcrystalline semiconductor region,
a pair of second wirings over the pair of second amorphous semiconductor regions;
the insulating layer over the pair of second wirings and the second microcrystalline semiconductor region; and
a back gate electrode over the insulating layer,
wherein the insulating layer in the pixel portion is over and in contact with the first amorphous semiconductor region in a first region that overlaps with a region between the pair of the first wirings,
wherein the insulating layer in the pixel portion is not in contact with the first microcrystalline semiconductor region in the first region,
wherein the insulating layer in the driver circuit is over and in contact with the first amorphous semiconductor region and the second microcrystalline semiconductor region in a second region that overlaps with a region between the pair of the second wirings, and
wherein the first gate electrode is wider than the first microcrystalline semiconductor region and the first amorphous semiconductor region.

8. The display device according to claim 7,
wherein the first microcrystalline semiconductor region has a first projected portion whose tip is narrowed from the gate insulating layer toward the first amorphous semiconductor region, and
wherein the second microcrystalline semiconductor region has a second projected portion whose tip is narrowed from the gate insulating layer toward the the pair of second amorphous semiconductor regions.

9. The display device according to claim 8, wherein the each tip of the first projected portion and the second projected portion has an obtuse angle.

10. The display device according to claim 7, wherein semiconductor crystal grains are included in the first amorphous semiconductor region and the pair of second amorphous semiconductor regions.

11. The display device according to claim 7,
wherein the single-gate transistor further comprises a pair of first impurity regions provided between the first amorphous semiconductor region and the pair of first wirings, and
wherein the dual-gate transistor further comprises a pair of second impurity regions provided between the pair of second amorphous semiconductor regions and the pair of second wirings.

12. The display device according to claim 7,
wherein the pair of first wirings are in contact with a side surface of the first microcrystalline semiconductor region and a side surface of the first amorphous semiconductor region, and
wherein the pair of second wirings are in contact with a side surface of the second microcrystalline semiconductor region and a side surface of the pair of second amorphous semiconductor regions.

13. A display device comprising:
a substrate;
a pixel portion including a single-gate transistor, the single-gate transistor comprising:
a first gate electrode over the substrate;
a gate insulating layer over the first gate electrode;
a first semiconductor layer over the gate insulating layer, the first semiconductor layer comprising:
a first microcrystalline semiconductor region over the gate insulating layer; and
a first amorphous semiconductor region over the first microcrystalline semiconductor region,
a pair of first wirings over the first amorphous semiconductor region; and
an insulating layer over the pair of first wirings and the first amorphous semiconductor region,
a driver circuit including a dual-gate transistor, the dual-gate transistor comprising:
a second gate electrode over the substrate;
the gate insulating layer over the second gate electrode;
a second semiconductor layer over the gate insulating layer, the second semiconductor layer comprising:

a second microcrystalline semiconductor region over the gate insulating layer; and a pair of second amorphous semiconductor regions over the second microcrystalline semiconductor region, a pair of second wirings over the pair of second amorphous semiconductor regions;

the insulating layer over the pair of second wirings and the second microcrystalline semiconductor region; and a back gate electrode over the insulating layer, wherein the insulating layer in the pixel portion is over and in contact with the first amorphous semiconductor region in a first region that overlaps with a region between the pair of the first wirings, wherein the insulating layer in the pixel portion is not in contact with the first microcrystalline semiconductor region in the first region, wherein the insulating layer in the driver circuit is over and in contact with the first amorphous semiconductor region and the second microcrystalline semiconductor region in a second region that overlaps with a region between the pair of the second wirings, and wherein the second gate electrode is electrically connected to the back gate electrode.

14. The display device according to claim 13, wherein the first microcrystalline semiconductor region has a first projected portion whose tip is narrowed from the gate insulating layer toward the first amorphous semiconductor region, and wherein the second microcrystalline semiconductor region has a second projected portion whose tip is narrowed from the gate insulating layer toward the pair of second amorphous semiconductor regions.

15. The display device according to claim 14, wherein the each tip of the first projected portion and the second projected portion has an obtuse angle.

16. The display device according to claim 13, wherein semiconductor crystal grains are included in the first amorphous semiconductor region and the pair of second amorphous semiconductor regions.

17. The display device according to claim 13, wherein the single-gate transistor further comprises a pair of first impurity regions provided between the first amorphous semiconductor region and the pair of first wirings, and wherein the dual-gate transistor further comprises a pair of second impurity regions provided between the pair of second amorphous semiconductor regions and the pair of second wirings.

18. The display device according to claim 13, wherein the pair of first wirings are in contact with a side surface of the first microcrystalline semiconductor region and a side surface of the first amorphous semiconductor region, and wherein the pair of second wirings are in contact with a side surface of the second microcrystalline semiconductor region and a side surface of the pair of second amorphous semiconductor regions.

* * * * *